US012765000B2

(12) United States Patent
Huang et al.

(10) Patent No.: US 12,765,000 B2
(45) Date of Patent: Oct. 13, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Yu-Xuan Huang, Hsinchu (TW); Shih-Cheng Chen, New Taipei City (TW); Jin Cai, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 351 days.

(21) Appl. No.: 18/630,353

(22) Filed: Apr. 9, 2024

(65) Prior Publication Data

US 2025/0254919 A1 Aug. 7, 2025

Related U.S. Application Data

(60) Provisional application No. 63/628,000, filed on Feb. 1, 2024.

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |

(Continued)

(52) U.S. Cl.

CPC ....... *H10D 30/6735* (2025.01); *H10D 30/014* (2025.01); *H10D 30/43* (2025.01); *H10D 30/6757* (2025.01); *H10D 62/121* (2025.01); *H10D 64/017* (2025.01); *H10D 84/017* (2025.01); *H10D 84/0172* (2025.01); *H10D 84/038* (2025.01); *H10D 84/85* (2025.01); *H10P 50/695* (2026.01)

(58) Field of Classification Search

None

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Kyoung Lee

(74) *Attorney, Agent, or Firm* — Birch, Stewart, Kolasch & Birch, LLP

(57) ABSTRACT

A method for forming a semiconductor structure is provided. The method includes forming a first fin structure in a first p-type device region and a second fin structure in a second p-type device region. Each of the first fin structure and the second fin structure includes alternatingly stacking first semiconductor layers and second semiconductor layers. The method also includes etching the first fin structure and the second fin structure to form a first recess and a second recess, respectively, forming a first patterned mask layer to cover the second p-type device region, laterally recessing the second semiconductor layers of the first fin structure to form first notches, removing the first patterned mask layer, forming a first p-type source/drain feature in the first recess and the notches, and forming a second p-type source/drain feature in the second recess.

20 Claims, 37 Drawing Sheets

(51) Int. Cl.
*H10D 84/85* (2025.01)
*H10P 50/00* (2026.01)

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2021/0226020 | A1* | 7/2021 | Lin .................... | H10D 30/6757 |

* cited by examiner

SEMICONDUCTOR STRUCTURE AND METHOD FOR FORMING THE SAME

PRIORITY CLAIM

This application claims the benefit of U.S. Provisional Application No. 63/628,000, filed on Feb. 1, 2024 and entitled "Semiconductor device with different junction profiles and Method for forming the same," which is incorporated herein by reference.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with related complementary metal-oxide-semiconductor (CMOS) processes, and their structure allows them to be aggressively scaled-down while maintaining gate control and mitigating SCEs. In related processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F, 2G-1, 2G-2, 2H-1, 2H-2, 2I-1, 2I-2, 2J-1, 2J-2, 2K-1, 2K-2, 2L-1, 2L-2, 2M-1 and 2M-2 are cross-sectional views illustrating the formation of a semiconductor structure at various intermediate stages, in accordance with some embodiments of the disclosure.

FIGS. 2G-3, 2I-3 and 2M-3 are plan views illustrating the formation of a semiconductor structure at various intermediate stages, in accordance with some embodiments of the disclosure.

FIGS. 3A-1, 3A-2, 3B-1 and 3B-2 are cross-sectional views illustrating the formation of a semiconductor structure at various intermediate stages, in accordance with some embodiments of the disclosure.

FIGS. 4A-1, 4A-2, 4B-1 and 4B-2 are cross-sectional views illustrating the formation of a semiconductor structure at various intermediate stages, in accordance with some embodiments of the disclosure.

FIG. 4B-3 is a plan view of a semiconductor structure, in accordance with some embodiments of the disclosure.

FIGS. 5-1 and 5-2 illustrate modification of the semiconductor structure of FIGS. 2M-1 and 2M-2, in accordance with some embodiments of the disclosure.

FIG. 5-3 is a plan view a semiconductor structure, in accordance with some embodiments of the disclosure.

FIGS. 6A-1, 6A-2, 6B-1 and 6B-2 are cross-sectional views illustrating the formation of a semiconductor structure at various intermediate stages, in accordance with some embodiments of the disclosure.

FIG. 6B-3 is a plan view of a semiconductor structure e, in accordance with some embodiments of the disclosure.

DETAILED DESCRIPTION

Figure 1:
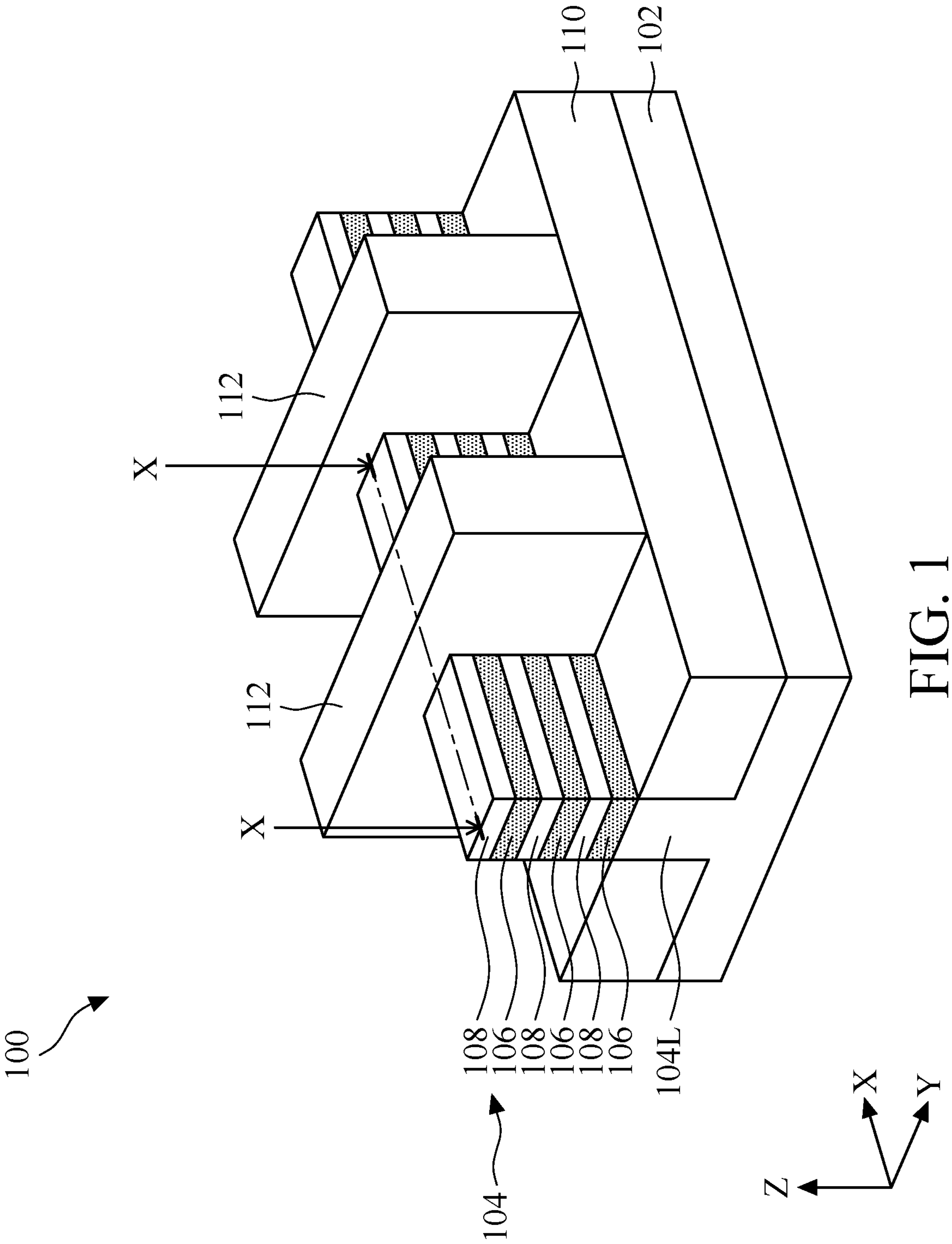
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to a semiconductor structure having various devices with different threshold voltages. An epitaxial (EPI) proximity push process is selectively performed on a first p-type transistor with ultra-low threshold voltage while a second p-type transistor with low or standard threshold voltage may be not subjected to the EPI proximity push process. As a result, the source/drain junction of the first p-type transistor is pushed closer to the channel region than the source/drain junction of the second p-type transistor. Therefore, the on-state current of the first p-type transistor may be improved, while maintaining the power saving of the second p-type transistor.

FIG. 1 is a perspective view of a semiconductor structure 100, in accordance with some embodiments of the disclosure.

The semiconductor structure 100 includes a substrate 102 and a fin structure 104 over the substrate 102, as shown in FIG. 1, in accordance with some embodiments. The fin structure 104 is the active region of the semiconductor structure 100, in accordance with some embodiments. The fin structure 104 includes a lower fin element 104L formed from the substrate 102, in accordance with some embodiments. The lower fin element 104L is surrounded by an isolation structure 110, in accordance with some embodiments. The fin structure 104 further includes an upper fin element formed from an epitaxial stack including alternating first semiconductor layers 106 and second semiconductor layers 108, in accordance with some embodiments. The second semiconductor layers 108 will form nanostructures (e.g., nanowires or nanosheets) and serve as the channel for the resulting semiconductor devices, in accordance with some embodiments.

For a better understanding of the semiconductor structure 100, the X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 104 extends in the X direction, in accordance with some embodiments. That is, the fin structure 104 has a longitudinal axis parallel to the X direction, in accordance with some embodiments. The X direction may also be referred to as the channel-extending direction. The current of the resulting semiconductor device (i.e., nanostructure transistor) flows in the X direction through the channel. The fin structure 104 is defined as several channel regions and several source/drain regions, where the channel regions and the source/drain regions are alternately arranged, in accordance with some embodiments. It is noted that in the present disclosure, source/drain region(s) may refer to a source or a drain, individually or collectively dependent upon the context.

Gate structures 112 are formed with longitudinal axes parallel to the Y direction and extending across and/or surrounding the channel regions of the fin structure 104, in accordance with some embodiments. The source/drain regions of the fin structure 104 are exposed from the gate structure 112, in accordance with some embodiments. The Y direction may also be referred to as a gate-extending direction.

FIG. 1 further illustrates a reference cross-section that is used in later figures. Cross-section X-X is in a plane parallel to the longitudinal axis (X direction) of the fin structure 104 and through the fin structure 104, in accordance with some embodiments.

FIGS. 2A, 2B, 2C, 2D, 2E, 2F, 2G-1, 2G-2, 2H-1, 2H-2, 2I-1, 2I-2, 2J-1, 2J-2, 2K-1, 2K-2, 2L-1, 2L-2, 2M-1 and 2M-2 are cross-sectional views illustrating the formation of a semiconductor structure 100 corresponding to line X-X of FIG. 1 at various intermediate stages, in accordance with some embodiments of the disclosure.

FIGS. 2A-2F only show one device region of the semiconductor structure 100, the semiconductor structure 100 may include multiple device regions, with various types of transistors having different threshold voltages (e.g., ultra-low voltage, low voltage or standard voltage) formed in each device region, which will be shown in FIGS. 2G-1 through 2M-2. The figures ending with "–1" (e.g., FIGS. 2G-1 to 2M-1) illustrate p-type device regions of the semiconductor structure 100, and the figures ending with "–2" (e.g., FIGS. 2G-2 to 2M-2) illustrate n-type device regions of the semiconductor structure 100. It should be noted that the process steps described in FIGS. 2A-2F are performed in each device region discussed in FIGS. 2G-1 through 2M-2.

Figure 2C:
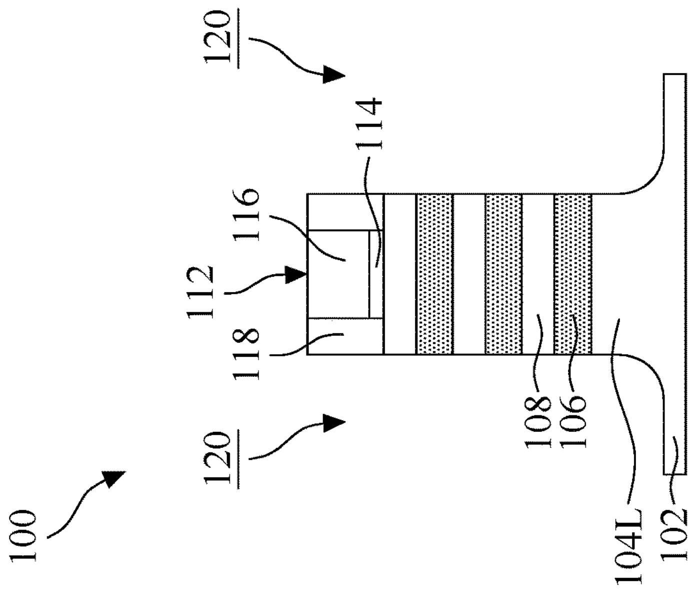
Figure 2B:
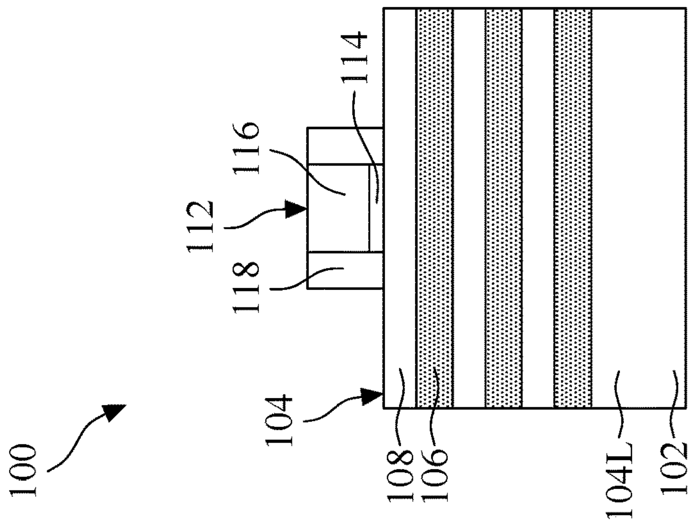
Figure 2A:
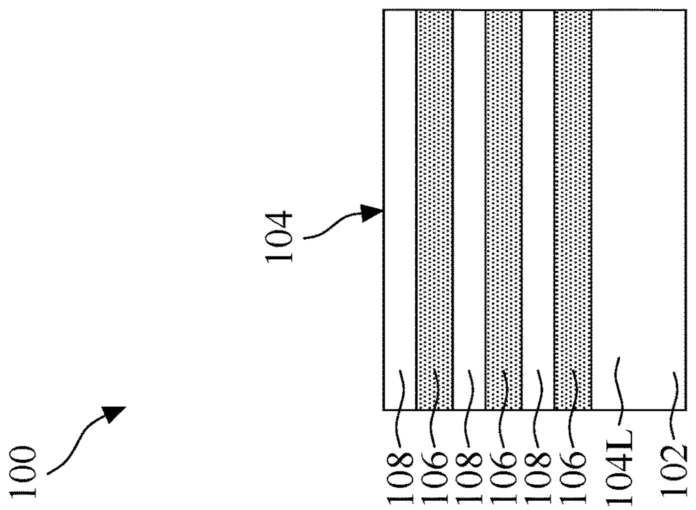

FIG. 2A illustrates a semiconductor structure 100 after the formation of an active region 104, in accordance with some embodiments.

A semiconductor structure 100 is provided, as shown in FIG. 2A, in accordance with some embodiments. The semiconductor structure 100 includes a substrate 102 and a fin structure 104, in accordance with some embodiments. The fin structure 104 extends in the X direction, in accordance with some embodiments.

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the fin structure 104 includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material with a different composition than the first semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity.

In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In an embodiment, the second semiconductor layers 108 are undoped such as intrinsic silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, in accordance with some embodiments. The second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shape and/or sheet shape. A gate stack (not shown) will be formed across and wrap around the nanostructures, in accordance with some embodiments.

In some embodiments, the thickness of each of the first semiconductor layers 106 is in a range from about 3 nm to about 20 nm, such as about 4 nm to about 12 nm. In some embodiments, the thickness of each of the second semiconductor layers 108 is in a range from about 3 nm to about 20 nm, such as about 4 nm to about 12 nm. The thickness of the second semiconductor layers 108 may be greater than, equal to, or less than the first semiconductor layers 106, which may depend on the amount of gate materials to be filled into spaces where the first semiconductor layers 106 are removed.

Although three first semiconductor layers 106 and three second semiconductor layers 108 are shown in FIG. 2A, the numbers are not limited to three, and can be 1, 2 or more than 3, and is less than 20. By adjusting the number of the semiconductor layers, the driving current of the resulting semiconductor device can be adjusted.

The epitaxial stack (including the first semiconductor layers 106 and the second semiconductor layers 108) are patterned using photolithography and etching processes to form trenches and the fin structure 104 protruding from between the trenches, in accordance with some embodiments. The portion of the substrate 102 protruding from between the trenches serves as a lower fin element 104L of the active region 104, in accordance with some embodiments. A remainder of the epitaxial stack (including the first semiconductor layers 106 and the second semiconductor layers 108) serves as an upper fin element of the active region 104, in accordance with some embodiments. In some embodiments, the fin structure 104 is the fin structure 104 as shown in FIG. 1.

An isolation structure (as shown in FIG. 1) is formed to surround the lower fin element 104L of the fin structure 104, in accordance with some embodiments. The isolation structure is configured to electrically isolate adjacent active regions (e.g., the semiconductor fin structures 104) of the semiconductor structure 100 and is also referred to as a shallow trench isolation (STI) feature, in accordance with some embodiments.

In some embodiments, the isolation structure is made of dielectric material such as silicon oxide ($SiO_2$), silicon nitride (SiN), silicon oxynitride (SiON), another suitable insulating material, multilayers thereof, or a combination thereof. The formation of the isolation structure includes depositing a dielectric material over the fin structure 104 and the substrate 102, in accordance with some embodiments. In some embodiments, the deposition process includes CVD such as low-pressure CVD (LPCVD), plasma-enhanced CVD (PECVD), high density plasma CVD (HDP-CVD), high aspect ratio process (HARP), or flowable CVD (FCVD)), atomic layer deposition (ALD), another suitable technique, or a combination thereof.

A planarization process (such as an etching-back process and/or a chemical mechanical polishing (CMP) process) is then performed to remove a portion of the dielectric material above the fin structure 104, in accordance with some embodiments. The dielectric material is then recessed using an etching process (such as an anisotropic etching process such as dry plasma etching) to expose the upper fin element, in accordance with some embodiments.

FIG. 2B illustrates a semiconductor structure 100 after the formation of a dummy gate structure 112 and gate spacer layers 118, in accordance with some embodiments.

A dummy gate structure 112 is formed across the fin structure 104 and the isolation structure, as shown in FIGS. 2B, in accordance with some embodiments. The dummy gate structure 112 is configured as a sacrificial structure and will be replaced with the final gate stack, in accordance with some embodiments. In some embodiments, the dummy gate structure 112 extends in the Y direction (as shown in FIG. 1). The dummy gate structure 112 surrounds the channel regions of the active region 104, in accordance with some embodiments.

The dummy gate structure 112 includes a dummy gate dielectric layer 114 and a dummy gate electrode layer 116 over the dummy gate dielectric layer 114, in accordance with some embodiments. In some embodiments, the dummy gate dielectric layer 114 is conformally formed along the upper fin element of the fin structure 104 using ALD, CVD, thermal oxidation, physical vapor deposition (PVD), another suitable technique, or a combination thereof. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTiO, HfAlO.

In some embodiments, the dummy gate electrode layer 116 is made of semiconductor material such as polysilicon or poly-silicon germanium. In some embodiments, the material for the dummy gate electrode layer 116 is deposited using CVD, ALD, another suitable technique, or a combination thereof. Once the material for the dummy gate electrode layer 116 is deposited, the material for the dummy gate electrode layer 116 is planarized, and the material for the dummy gate electrode layer 116 and the dielectric material are patterned into the dummy gate structure 112 using photolithography and etching processes.

Gate spacer layers 118 are formed on the opposite sides of the dummy gate structure 112, as shown in FIG. 2B, in accordance with some embodiments. The gate spacer layers 118 are used to offset the subsequently formed source/drain features and separate the source/drain features from the gate structure, in accordance with some embodiments.

In some embodiments, the gate spacer layers 118 are made of dielectric material, such as silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the formation of the gate spacer layers 118 includes globally and conformally depositing a dielectric material for the gate spacer layers 118 over the semiconductor structure 100 using ALD, CVD (such as LPCVD, PECVD or HDP-CVD or a combination thereof, followed by an anisotropic etching process, in accordance with some embodiments. After the anisotropic etching process, the vertical portions of the dielectric material left remaining on the opposite sides of the dummy gate structure 112 form the gate spacer layers 120, in accordance with some embodiments.

FIG. 2C illustrates a semiconductor structure 100 after the formation of source/drain recesses 120, in accordance with some embodiments.

An etching process is performed to recess the source/drain regions of the fin structure 104, thereby forming source/drain recesses 120, as shown in FIG. 2C, in accordance with some embodiments. The etching process may be an anisotropic etching process such as dry plasma etching, an isotropic etching process such as dry chemical etching, remote plasma etching or wet chemical etching, and/or a combination thereof. The gate spacer layers 118 and the dummy gate structure 112 may serve as etch masks such that the source/drain recesses 120 are formed self-aligned on opposite sides of the dummy gate structure 112, in accordance with some embodiments. The bottoms of the source/drain recesses 120 extend into the lower fin elements 104L, in accordance with some embodiments.

Figure 2F:
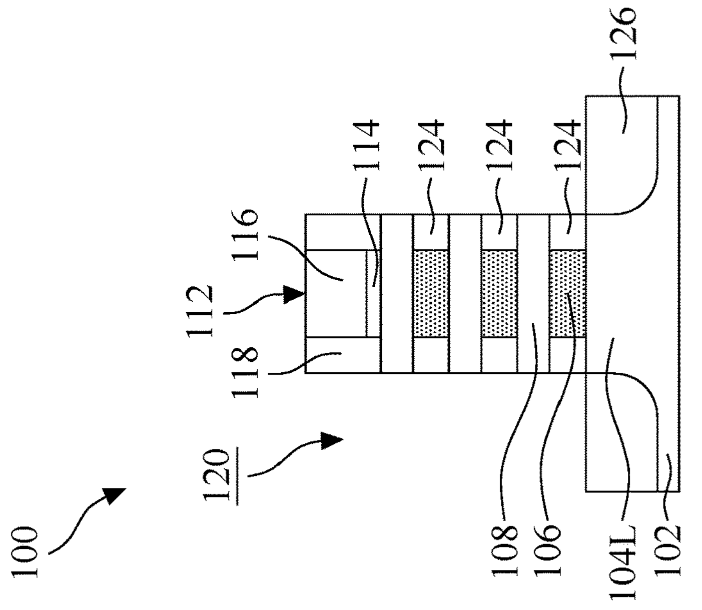
Figure 2E:
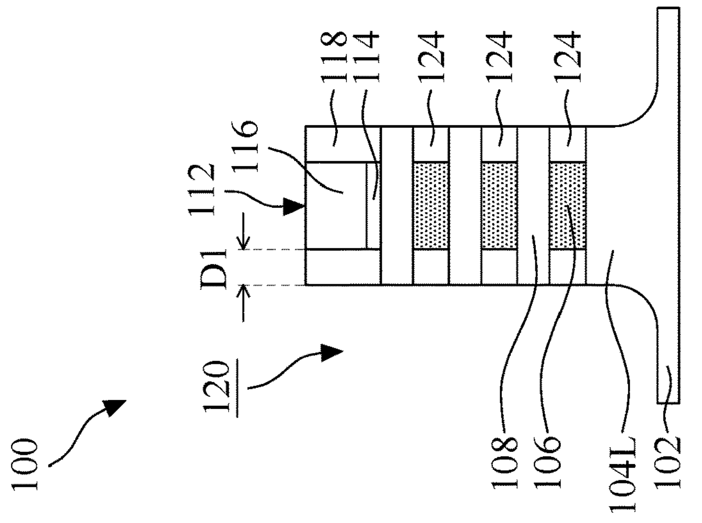
Figure 2D:
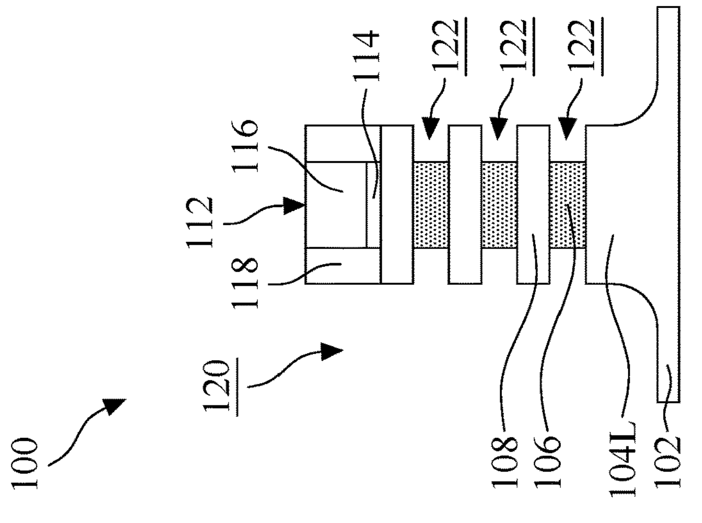

FIG. 2D illustrates a semiconductor structure 100 after the formation of notches 122, in accordance with some embodiments.

An etching process is performed to laterally recess, from the source/drain recesses 120 toward the channel region, the first semiconductor layers 106 of the fin structure 104 to form notches 122, as shown in FIG. 2D, in accordance with some embodiments. In some embodiments, the etching process is an isotropic etching such as dry chemical etching, remote plasma etching, wet chemical etching, another suitable technique, or a combination thereof. The notches 122 are formed between adjacent second semiconductor layers 108 and between the lowermost second semiconductor layer 108 and the lower fin element 104L, in accordance with some embodiments.

FIG. 2E illustrates a semiconductor structure 100 after the formation of inner spacer layers 124, in accordance with some embodiments.

Inner spacer layers 124 are formed in the notches 122, as shown in FIG. 2E, in accordance with some embodiments. The inner spacer layers 124 abut the recessed side surfaces of the first semiconductor layers 106, in accordance with some embodiments. The inner spacer layers 124 may avoid the source/drain features and the gate stack from being in direct contact and are configured to reduce the parasitic capacitance between the gate stack and the source/drain features (i.e., Cgs and Cgd), in accordance with some embodiments.

In some embodiments, the inner spacer layers 124 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), oxygen-doped silicon carbonitride (Si(O)CN), and/or a combination thereof. In some embodiments, the formation of the inner spacer layers 124 including depositing a dielectric material to fill the notches 122 using ALD, CVD (such as PECVD, LPCVD or HARP), another suitable technique, or a combination thereof, and etching away the dielectric material outside the notches 122 using an anisotropic etching process such as dry plasma etching, an isotropic etching process such as dry chemical etching, remote plasma etching or wet chemical etching, or a combination thereof.

In some embodiments, the inner spacer layers 124 are formed directly below the gate spacer layers 112, in accordance with some embodiments. In some embodiments, the inner spacer layers 124 and the gate spacer layers may have substantially the same dimension D1 in the X direction (e.g., width). In some embodiments, the dimension D1 is in a range from about 4 nm to about 8 nm.

FIG. 2F illustrates a semiconductor structure 100 after the formation of semiconductor isolation layers 126, in accordance with some embodiments.

Semiconductor isolation layers 126 are grown on the lower fin element 104L, as shown in FIGS. 2F, in accordance with some embodiments. In some embodiments, the semiconductor isolation layers 126 are made of an epitaxial semiconductor material such as silicon, silicon germanium or germanium, formed by MBE, MOCVD, or VPE, another suitable technique, or a combination thereof. In an embodiment, the semiconductor isolation layers 126 are made of non-doped silicon.

Figures 1, 2G:
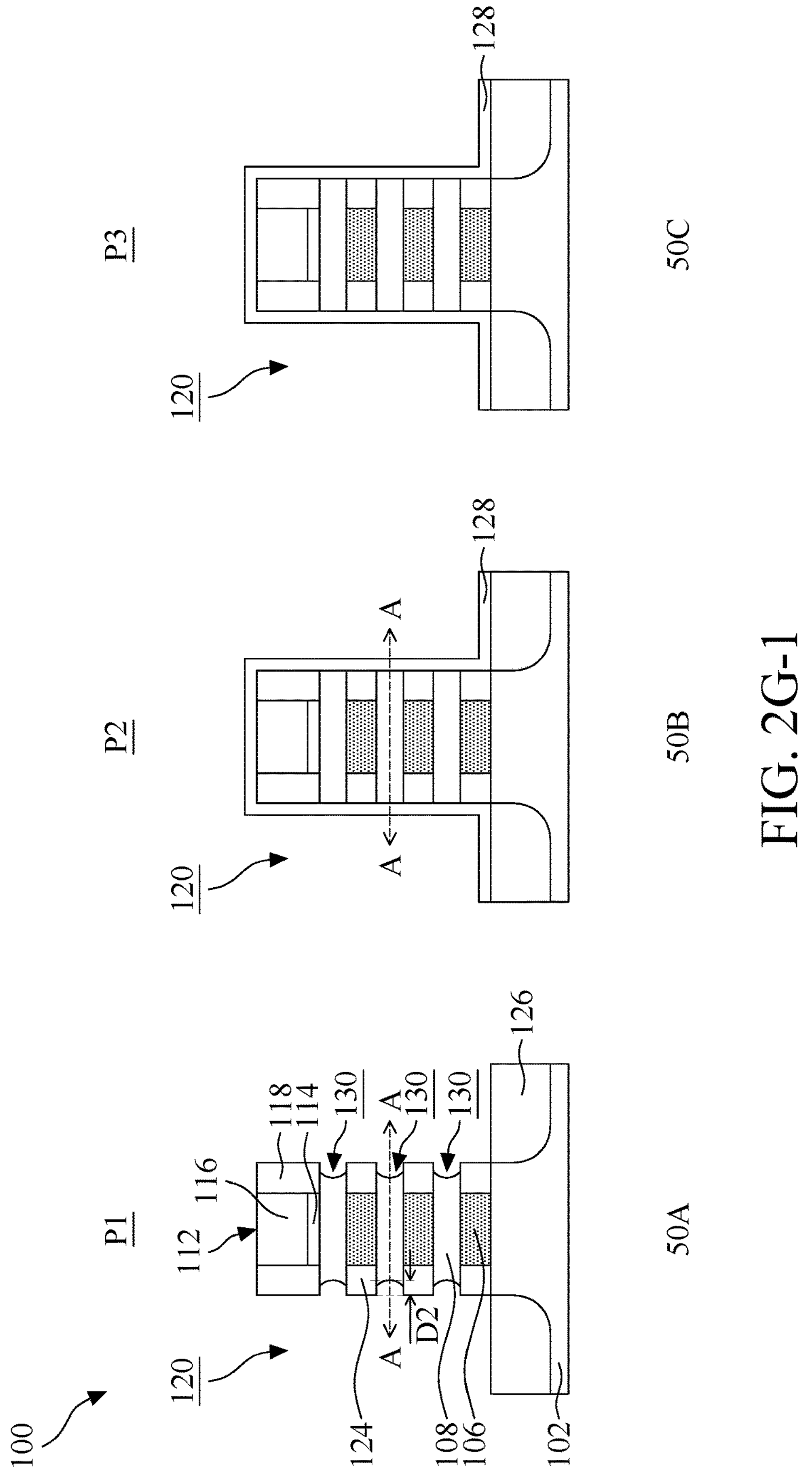
Figures 2, 2G:
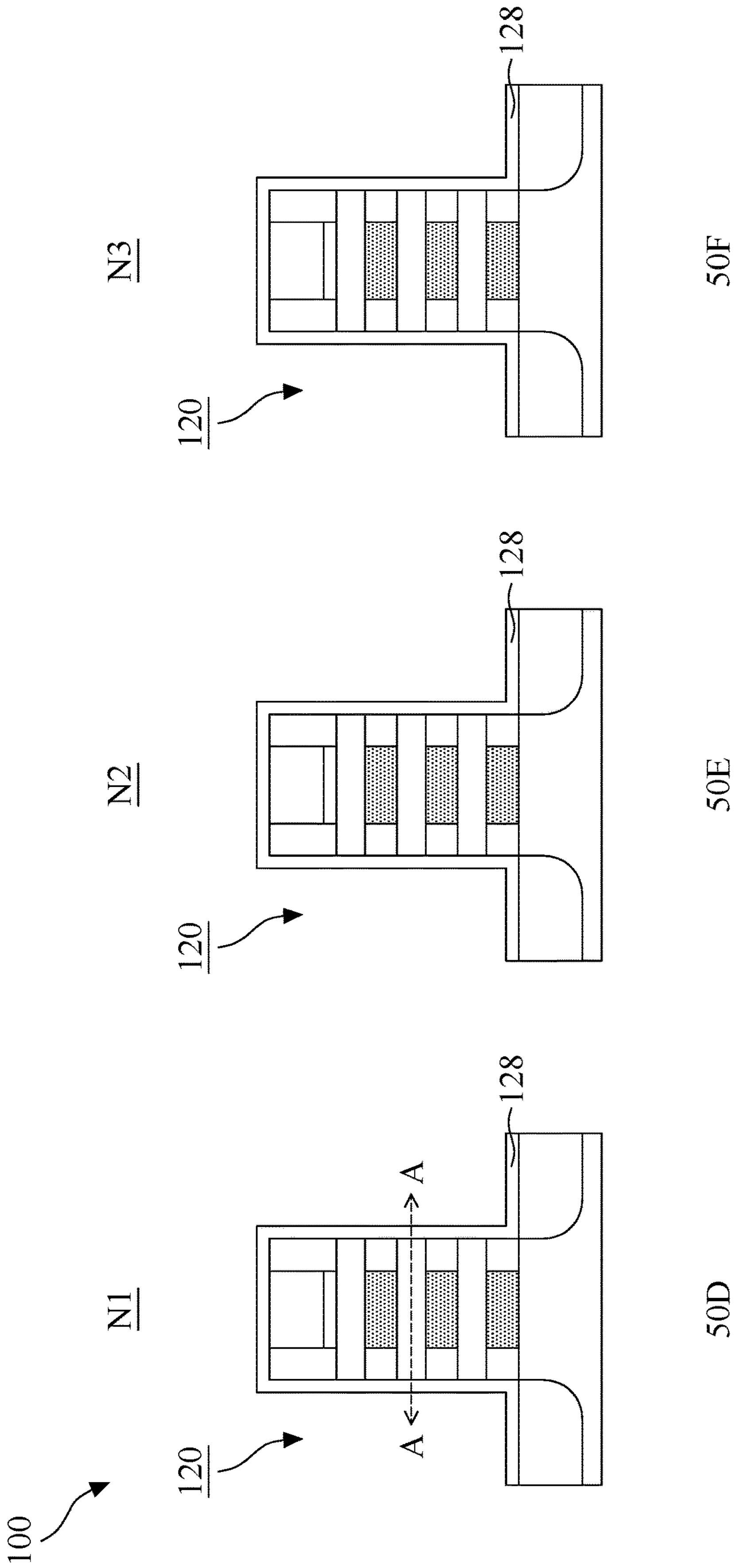
Figures 2, 2G, 3:
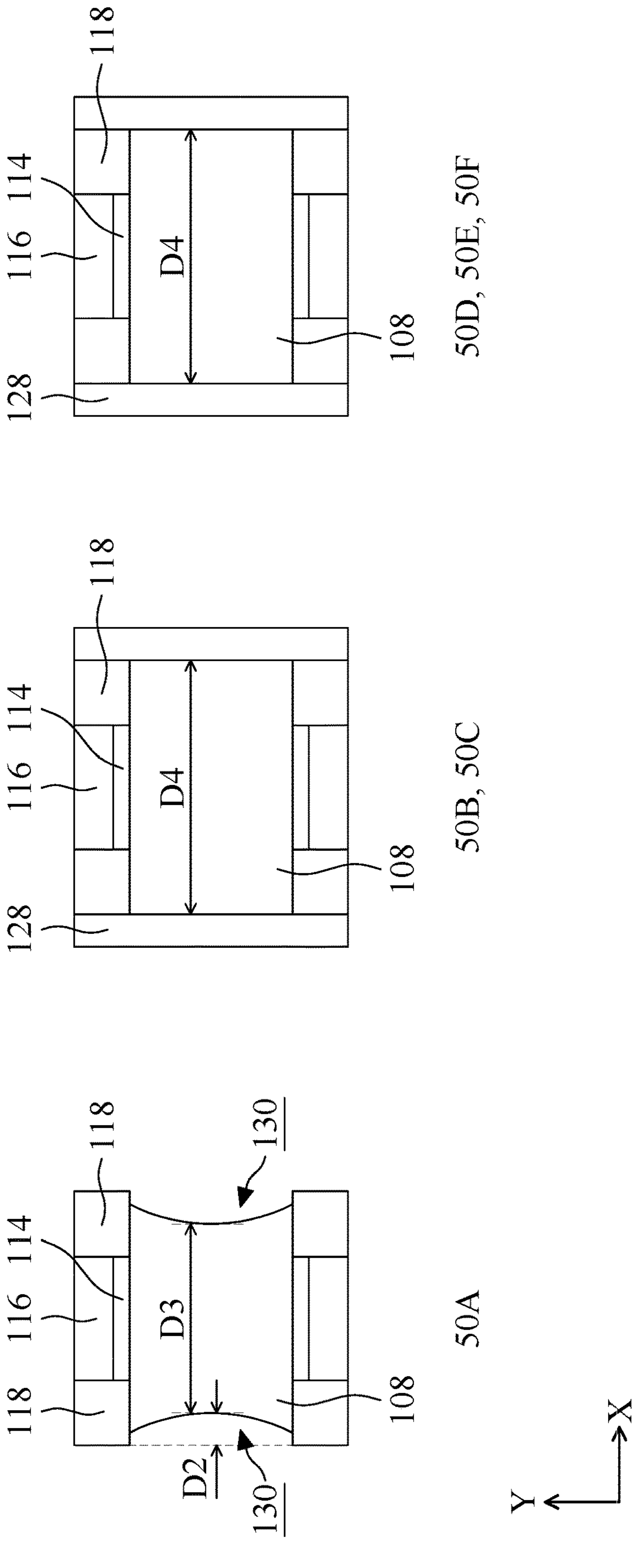

FIGS. 2G-1 and 2G-2 illustrate a semiconductor structure 100 after the formation of notches 130, in accordance with some embodiments. FIG. 2G-3 is a plan view corresponding to line A-A in FIGS. 2G-1 and 2G-2, in accordance with some embodiments of the disclosure.

The substrate 102 includes or may be defined into multiple device regions 50A-50F, as shown in FIGS. 2G-1 to 2G-3, in accordance with some embodiments. In some embodiments, a p-type transistor P1 is predetermined to be formed in the device region 50A and has a threshold voltage Vp1 (e.g., ultra-low threshold voltage), a p-type transistor P2 is predetermined to be formed in the device region 50B and has a threshold voltage Vp2 (e.g., low threshold voltage), and a p-type transistor P3 is predetermined to be formed in the device region 50C and has a threshold voltage Vp3 (e.g., standard voltage). Here, $Vp3<Vp2<Vp1<0$.

In some embodiments, an n-type transistor N1 is predetermined to be formed in the device region 50D and has a threshold voltage Vn1 (e.g., ultra-low threshold voltage), an n-type transistor N2 is predetermined to be formed in the device region 50E and has a threshold voltage Vn2 (e.g., low threshold voltage), and an n-type transistor N3 is predetermined to be formed in the device region 50F and has a threshold voltage Vn3 (e.g., standard voltage). Here, $0<Vn1<Vn2<Vn3$. In some embodiments, the n-type transistors N1, N2 and N3 are n-channel nanostructure transistors, and the p-type transistors P1, P2 and P3 are p-channel nanostructure transistors.

A patterned mask layer 128 is formed to cover the semiconductor structure 100 in the device regions 50B-50F, as shown in FIGS. 2G-1 to 2G-3, in accordance with some embodiments. The semiconductor structure 100 in the device region 50A is exposed from the patterned mask layer 128, in accordance with some embodiments.

In some embodiments, the formation of the patterned mask layer 128 includes globally and conformally depositing a hard mask layer using ALD or CVD over the semiconductor structure 100 followed by a patterning process. The hard mask layer is made of silicon-containing dielectric material such as silicon nitride (SiN), silicon oxynitride (SiON), silicon oxide ($SiO_2$), silicon oxynitride (SiOC), silicon carbide (SiC), or oxygen-doped silicon carbonitride (Si(O)CN); a metal oxide dielectric such as $Al_2O_3$, LaO, $HfO_2$, $Ta_2O_5$, $TiO_2$, $ZrO_2$, or $Y_2O_3$; another suitable mask material; or a combination thereof.

The patterning process includes forming a BARC material (such as an inorganic material or an organic material (e.g., polymer, oligomer, or monomer) using a spin-on coating process, a CVD process over the hard mask layer, forming a patterned photoresist layer on the BARC material corresponding to or overlapping the devices regions 50B-50F using a photolithography process, and etching the BARC material and the hard mask layer using the patterned photoresist layer to expose the device region 50A, in accordance with some embodiments.

The photolithography process may include forming a photoresist material, performing a pre-exposure baking process, performing an exposure process using a mask (or a reticle), performing a post-exposure baking process, and performing a developing process. In some embodiments, the etching process may be an anisotropic etching process such as dry plasma etching, an isotropic etching process such as dry chemical etching, remote plasma etching, wet chemical etching, or a combination thereof. The photoresist layer and BARC material may be removed in the etching process or by additional process (e.g., etching or ashing processes).

An etching process is then performed to laterally recess, from the source/drain recesses 120 toward the channel region, the second semiconductor layers 108 of the fin structure 104 in the device region 50A to form notches 130, as shown in FIGS. 2G-1 and 2G-3, in accordance with some embodiments. The patterned mask layer 128 protects the second semiconductor layers 108 in the device regions 50B-50F from being recessed, in accordance with some embodiments. In some embodiments, the etching process is an isotropic etching such as dry chemical etching, remote plasma etching, wet chemical etching, another suitable technique, or a combination thereof. Afterward, the patterned mask layer 128 is removed using an etching process (e.g., a dry chemical etching, and/or a wet etching).

In some embodiments, the etching process may be also referred to as the EPI proximity push process, which may facilitate in pushing in the source/drain junction and reduce effective gate length, thereby reducing RLDD (resistance of lightly doped drain (LDD) region). However, the EPI proximity push process may also reduce the gate control over the channel (e.g., resulting in increased short channel effect (SCE) to negatively impact on the power saving of the resulting semiconductor device).

Because the p-type transistor P1 with ultra-low threshold voltage has a relatively low energy barrier height and may focus on high on-state current, the reduction in RLDD by the EPI proximity push process may significantly reduce total resistance and increase the on-state current (e.g., saturated current (Idsat)) for the p-type transistor P1, thereby improving the performance of the resulting p-type transistor P1.

On the contrary, because the p-type transistors P2 and P3 with low and standard threshold voltages have a relatively high energy barrier height, the reduction in RLDD by the EPI proximity push process may have a slight reduction in total resistance. Furthermore, the p-type transistors P2 and P3 focus on power saving that may be affected by gate-control ability, and thus the semiconductor structure 100 in the p-type device regions 50B and 50C is not subjected to the EPI proximity push process. In some other embodiments where the p-type transistor P2 with low threshold voltage focuses more on high on-state current than power saving, the EPI proximity push process may be also performed on the semiconductor structure 100 in the p-type device region 50B.

On the other hand, the EPI proximity push process only has a slight improvement in on-state current for all of the n-type transistors N1, N2 and N3, but a higher negative impact on gate-control ability, and thus the semiconductor structure 100 in the n-type device regions 50D-50F is not subjected to the EPI proximity push process. In some other embodiments where the n-type transistor N1 with ultra-low threshold voltage focuses more on high on-state current than power saving, the EPI proximity push process may be also performed on the semiconductor structure 100 in the n-type device region 50D.

In some embodiments, the notches 130 are located directly below the gate spacer layers 118. In some embodiments, the recessed sidewalls of the second semiconductor layers 108 may be curved, e.g., concave. In some embodiments, the notches 130 have the maximum dimension (recessing depths) D2 that is less than the dimension D1 (FIG. 2E) of the inner spacer layers 124. In some embodiments, the dimension D2 is in a range from about 2 nm to about 3 nm. In some embodiments, the ratio of the dimension D2 to the dimension D1 is in a range from about to about 0.3 to 0.7.

In some embodiments, the second semiconductor layer 108 in the device region 50A has a dimension D3 that is less than the dimension D4 of the second semiconductor layers 108 in the device regions 50B-50F. In some embodiments, the dimension D3 is in a range from about 5 nm to about 50 nm. In some embodiments, the dimension D4 is in a range from about 8 nm to about 55 nm.

Figures 1, 2H:
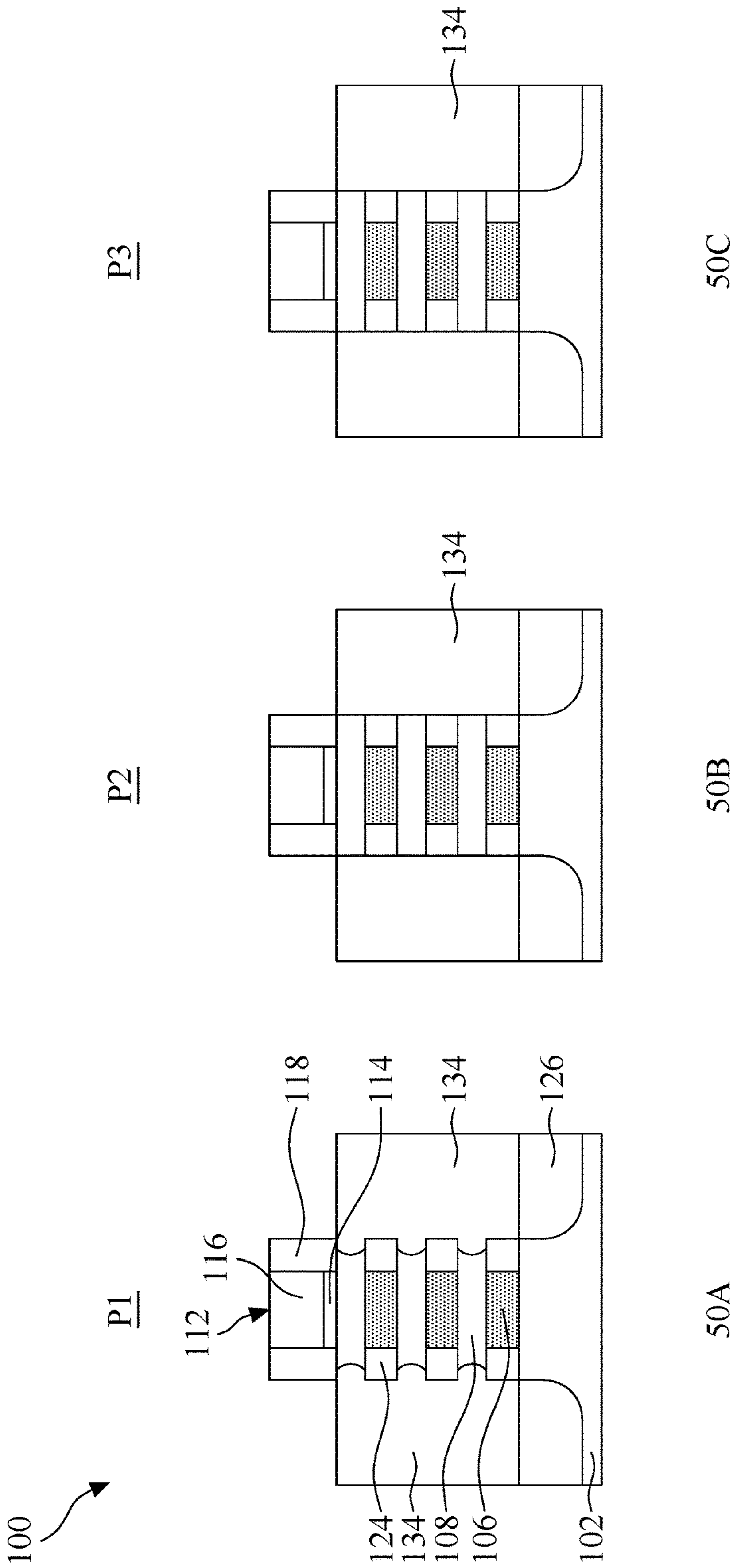
Figures 2, 2H:
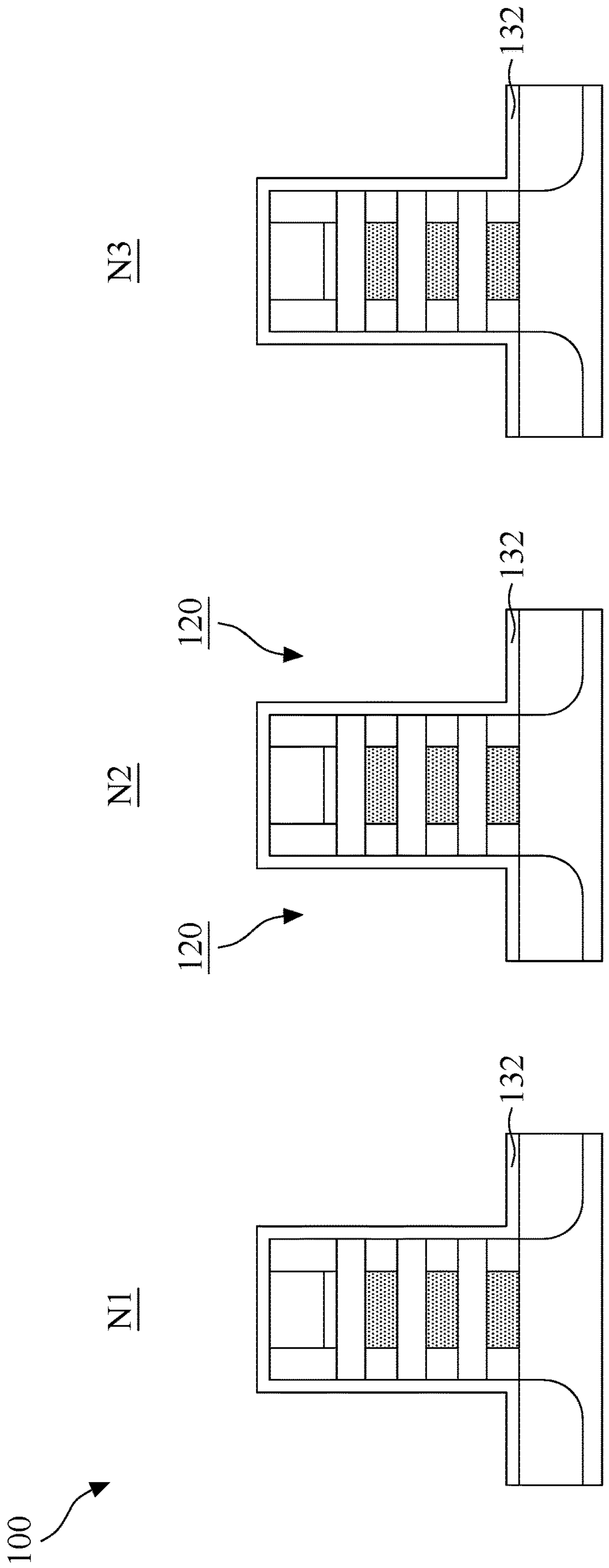

FIGS. 2H-1 and 2H-2 illustrate a semiconductor structure 100 after the formation of source/drain features 134, in accordance with some embodiments.

A first source/drain mask 132 is formed to cover the semiconductor structure 100 in the n-type device regions 50D-50F, as shown in FIG. 2H-2, in accordance with some embodiments. The semiconductor structure 100 in the p-type device regions 50A-50C is exposed from the first source/drain mask 132, in accordance with some embodiments. In some embodiments, the material and the formation method of the first source/drain mask 132 may be the same as or similar to the material and the formation method of the patterned mask layer 128.

In the p-type device regions 50A-50C, source/drain features 134 are formed on the semiconductor isolation layer 126 and the second semiconductor layers 108 using an epitaxial growth process, as shown in FIG. 2H-1, in accordance with some embodiments. The epitaxial growth process may be MBE, MOCVD, or VPE, another suitable technique, or a combination thereof. The source/drain features 126 fills the source/drain recesses 120 and the notches 130 in the device region 50A, as shown in FIGS. 2M-1, in accordance with some embodiments. The source/drain features 134 abut the second semiconductor layers 108 of the fin structures 104 and the inner spacer layers 124, in accordance with some embodiments. The sidewall of the source/drain features 134 in the device region 50A have convex portions that interface and mate with the concave sidewalls of the second semiconductor layers 108, in accordance with some embodiments.

In some embodiments, the source/drain features 134 are made of semiconductor material such as SiGe, Si, GaAs, another suitable semiconductor material, or a combination thereof. In some embodiments, the source/drain features 134 are doped with a p-type dopant during the epitaxial growth process. For example, the p-type dopant may be boron (B) or $BF_2$. For example, the source/drain features 134 may be the epitaxially grown SiGe doped with boron (B) to form silicon germanium:boron (SiGe:B) source/drain feature.

The first source/drain mask 132 may prevent the epitaxial semiconductor material from being grown in the regions 50D, 50E and 50F, in accordance with some embodiments. Afterwards, the first source/drain mask 132 is removed using an etching process (e.g., a dry chemical etching, and/or a wet etching).

Figures 1, 2I:
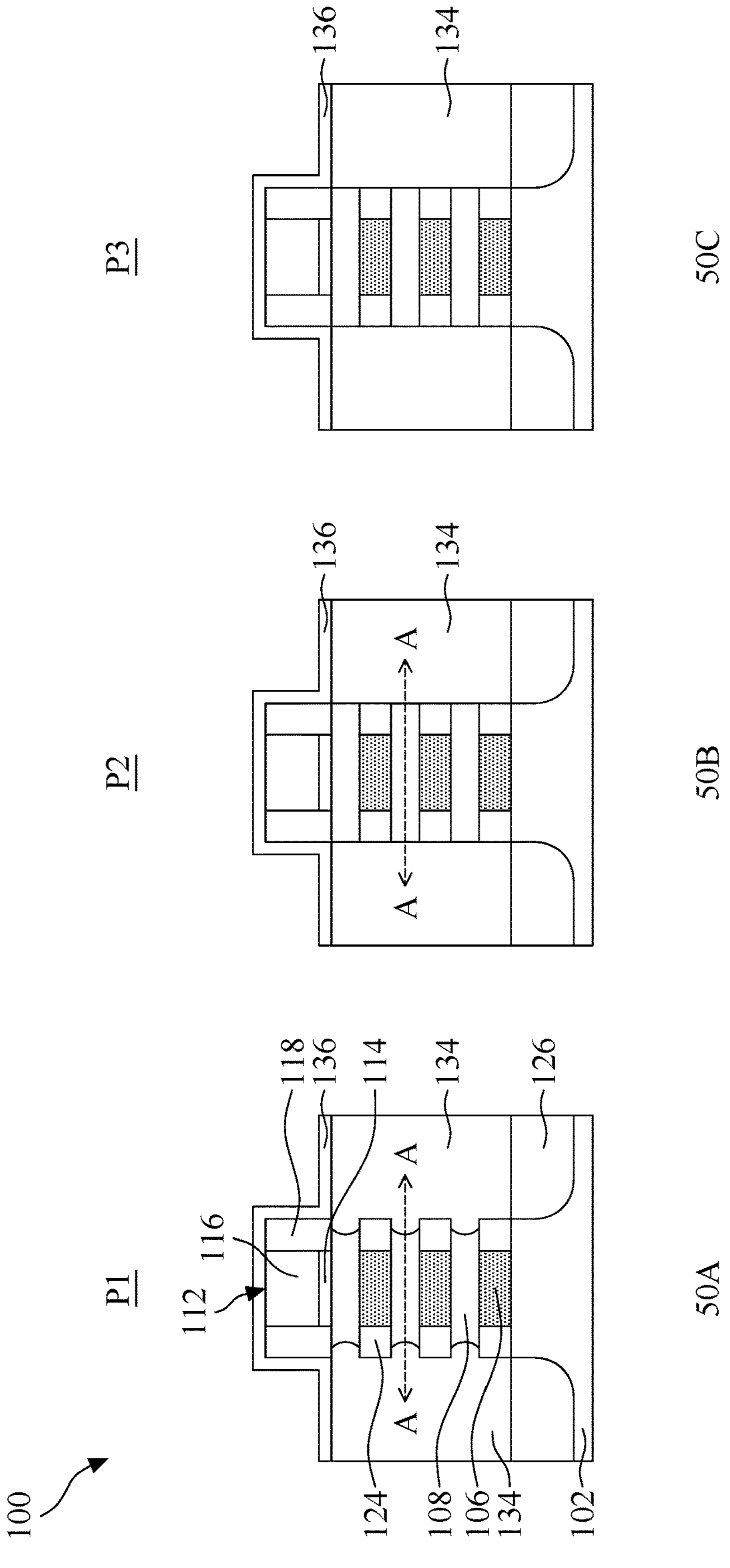
Figures 2, 2I:
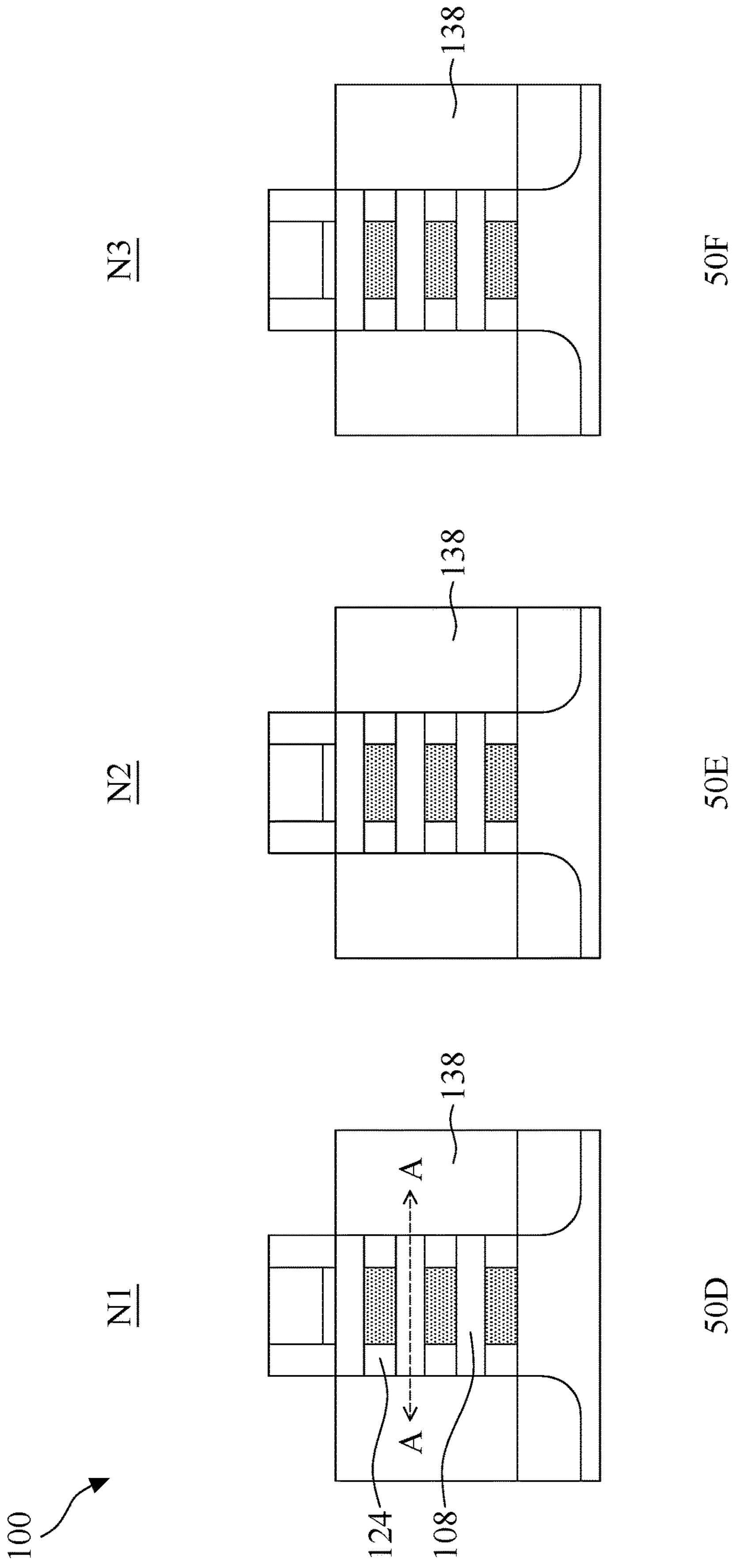
Figures 2, 2I, 3:
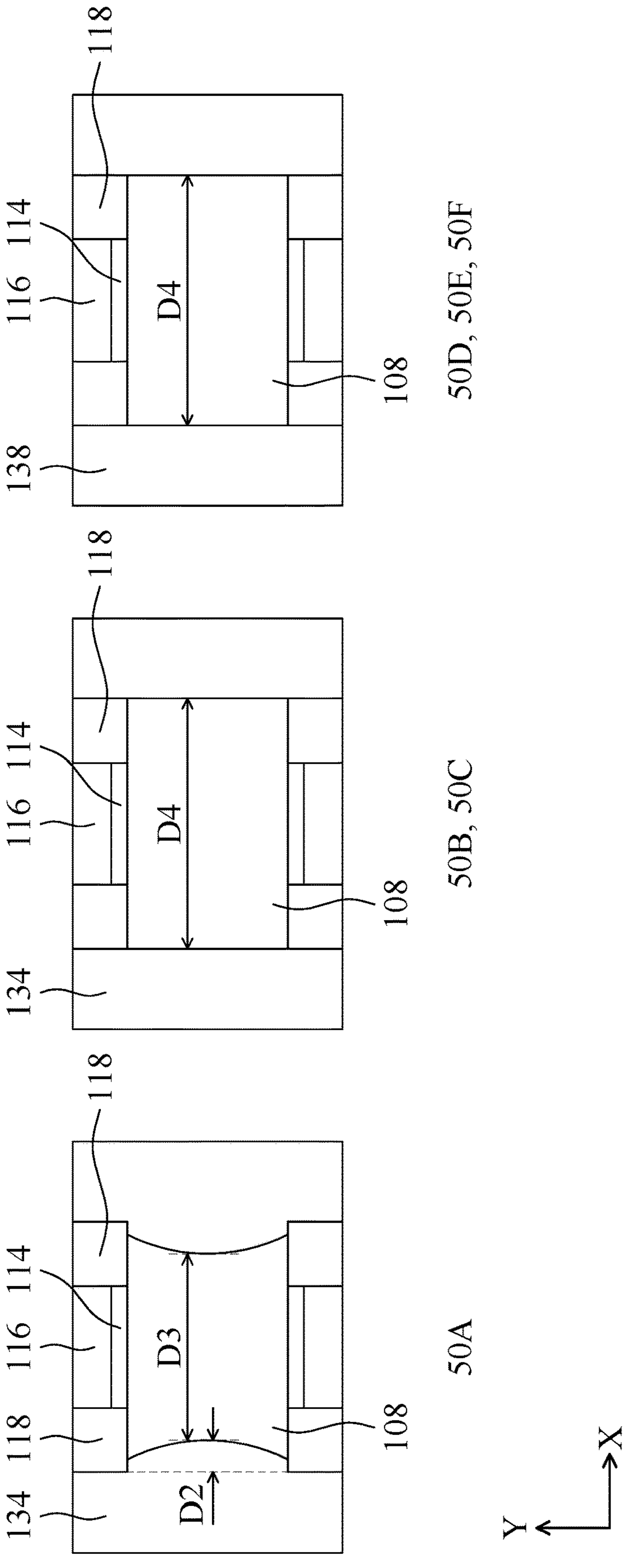

FIGS. 2I-1 and 2I-2 illustrate a semiconductor structure 100 after the formation of source/drain features 134, in accordance with some embodiments. FIG. 2I-3 is a plan view corresponding to line A-A in FIGS. 2I-1 and 2I-2, in accordance with some embodiments of the disclosure.

A second source/drain mask 136 is formed to cover the semiconductor structure 100 in the p-type device regions 50A-50C, as shown in FIG. 2I-1, in accordance with some embodiments. The semiconductor structure 100 in the n-type device regions 50D-50F is exposed from the second source/drain mask 136, in accordance with some embodiments. In some embodiments, the material and the formation method of the second source/drain mask 136 may be the same as or similar to the material and the formation method of the patterned mask layer 128.

In the n-type device regions 50D-50F, source/drain features 138 are formed on the semiconductor isolation layer 126 and the second semiconductor layers 108 using an epitaxial growth process, as shown in FIG. 2I-2, in accordance with some embodiments. The epitaxial growth process may be MBE, MOCVD, or VPE, another suitable technique, or a combination thereof. The source/drain features 138 fill the source/drain recesses 120, in accordance with some embodiments. The source/drain features 138 abut the second semiconductor layers 108 of the fin structures 104 and the inner spacer layers 124, in accordance with some embodiments.

In some embodiments, the source/drain features 138 are made of semiconductor material such as SiP, SiAs, SiCP, SiC, Si, GaAs, another suitable semiconductor material, or a combination thereof. In some embodiments, the source/drain features 138 are doped with an n-type dopant during the epitaxial growth process. For example, the n-type dopant may be phosphorous (P) or arsenic (As). For example, the source/drain features 138 may be the epitaxially grown Si doped with phosphorous to form silicon:phosphor (Si:P) source/drain features and/or arsenic to form silicon:arsenic (Si:As) source/drain feature.

The second source/drain mask 136 may prevent the epitaxial semiconductor material from being grown in the regions 50A, 50B and 50C, in accordance with some embodiments. Afterwards, the second source/drain mask 136 is removed using an etching process (e.g., a dry chemical etching, and/or a wet etching).

In some embodiments, the concentration of the dopant in the source/drain features 134 in a range from about $2\times10^{19}$ $cm^{-3}$ to about $6\times10^{21}$ $cm^{-3}$, and the concentration of the dopant in the source/drain features 138 in a range from about $1\times10^{19}$ $cm^{-3}$ to about $6\times10^{21}$ $cm^{-3}$. An annealing process may be performed on the semiconductor structure 100 to activate the dopants in the source/drain features 134 and 138, in accordance with some embodiments.

Figures 1, 2J:
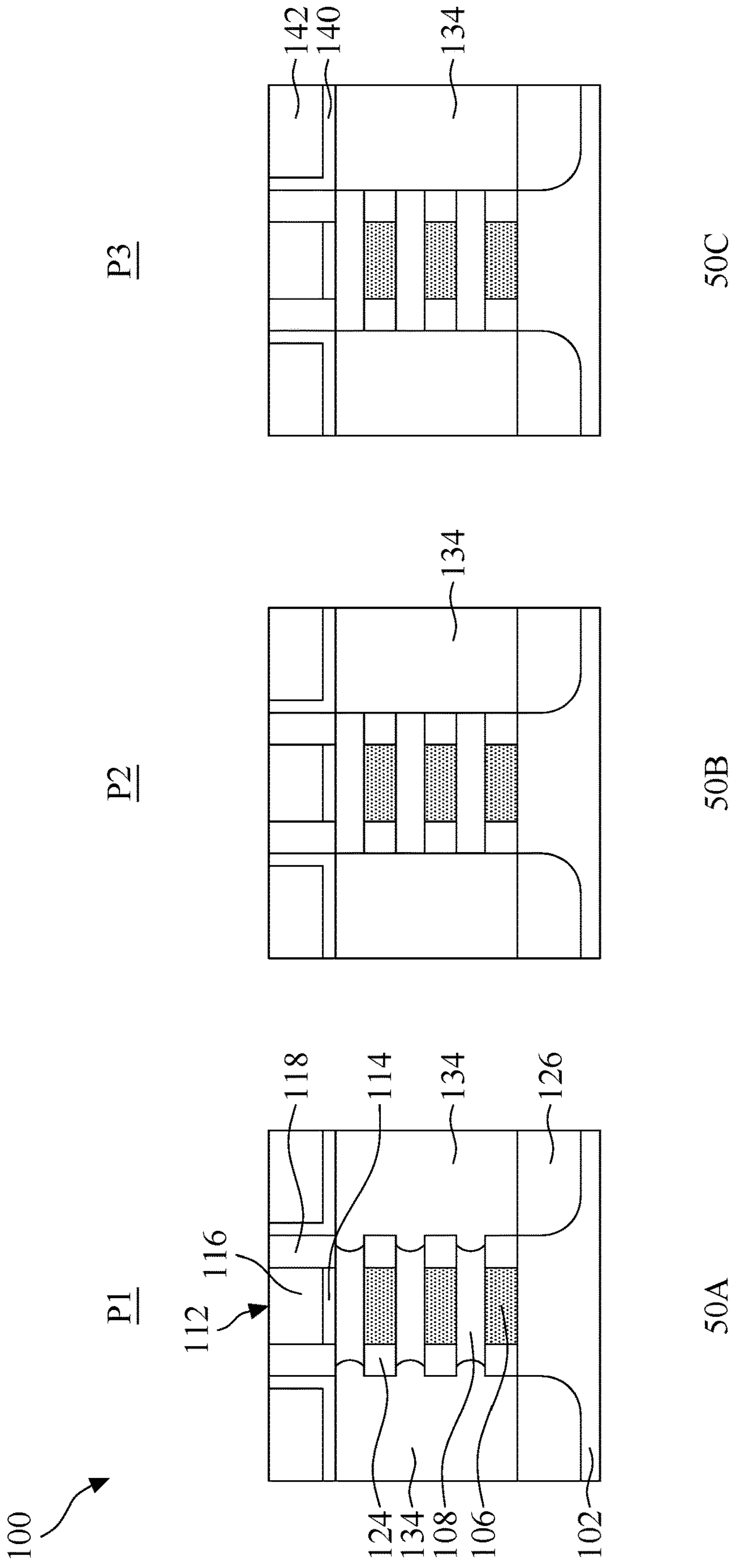
Figures 2, 2J:
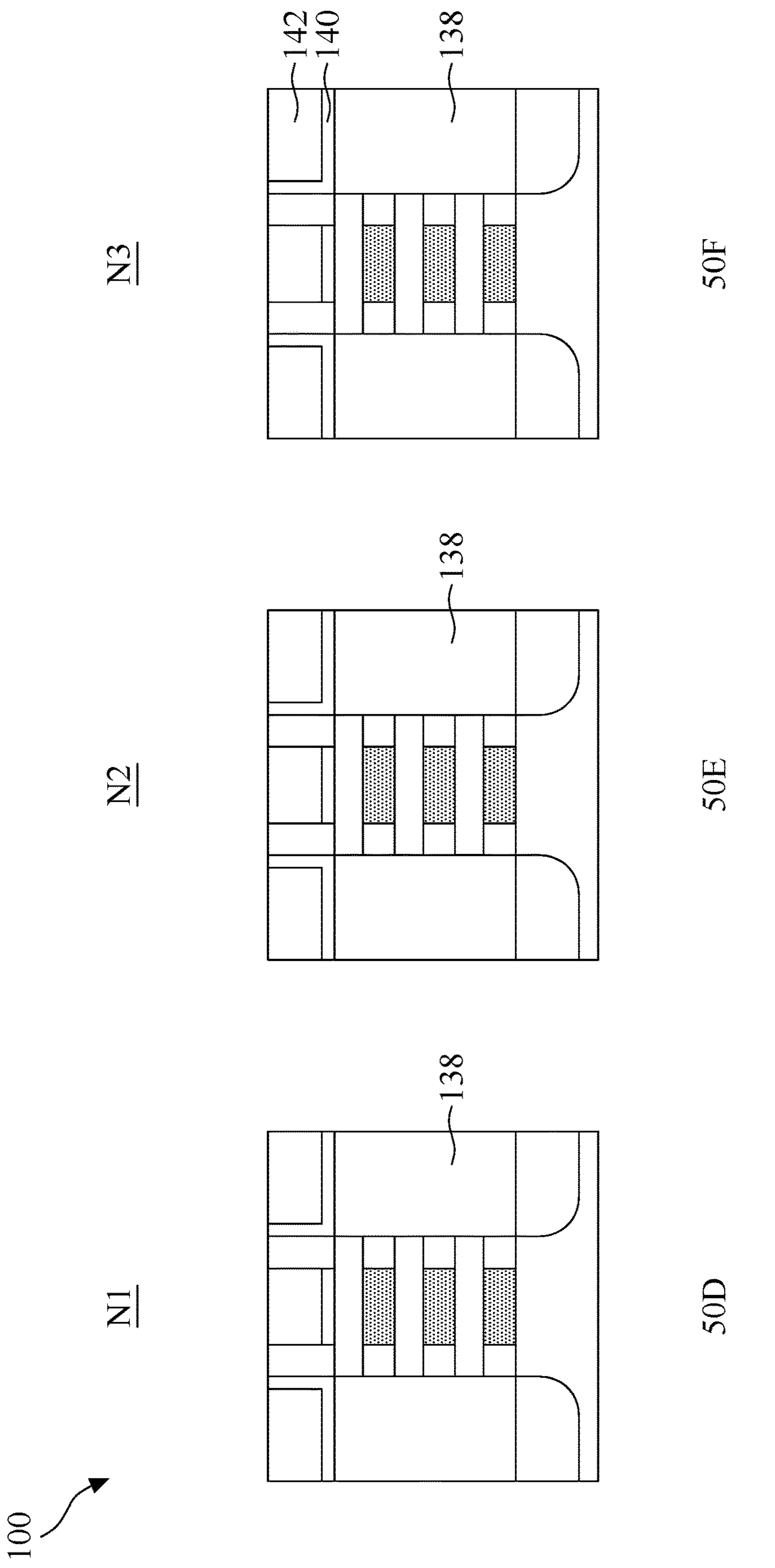

FIGS. 2J-1 and 2J-2 illustrate a semiconductor structure 100 after the formation of a contact etching stop layer (CESL) 140 and an interlayer dielectric (ILD) layer 142, in accordance with some embodiments.

A contact etching stop layer 140 is formed over the semiconductor structure 100, as shown in FIGS. 2J-1 and 2J-2, in accordance with some embodiments. In some embodiments, the contact etching stop layer 140 is made of dielectric material, such as silicon nitride (SiN), silicon oxide ($SiO_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 140 is globally and conformally deposited over the semiconductor structure 100 using CVD (such as LPCVD, PECVD, HDP-CVD, or HARP), ALD, another suitable method, or a combination thereof.

An interlayer dielectric layer 142 is formed over the contact etching stop layer 140, as shown in FIGS. 2J-1 and 2J-2, in accordance with some embodiments. In some embodiments, the interlayer dielectric layer 142 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 142 and the contact etching stop layer 140 are made of different materials and have a great difference in etching selectivity. In some embodiments, the dielectric material for the interlayer dielectric layer 142 is deposited using such as CVD (such as HDP-CVD, PECVD, HARP or FCVD), another suitable technique, or a combination thereof.

The dielectric materials for the contact etching stop layer 140 and the interlayer dielectric layer 142 formed above the upper surface of the dummy gate electrode layer 116 are removed using such as CMP until the dummy gate electrode layer 116 is exposed, in accordance with some embodiments.

Figures 1, 2K:
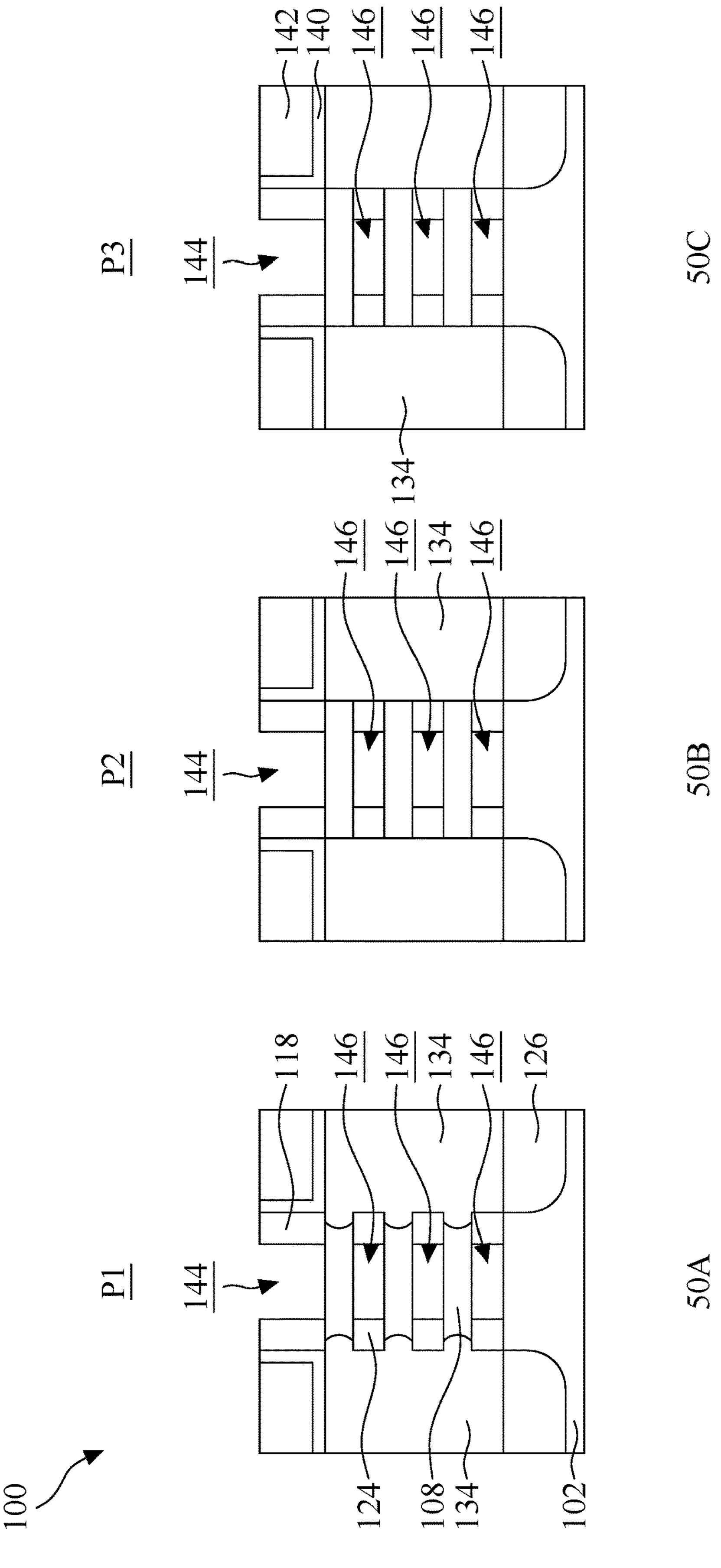
Figures 2, 2K:
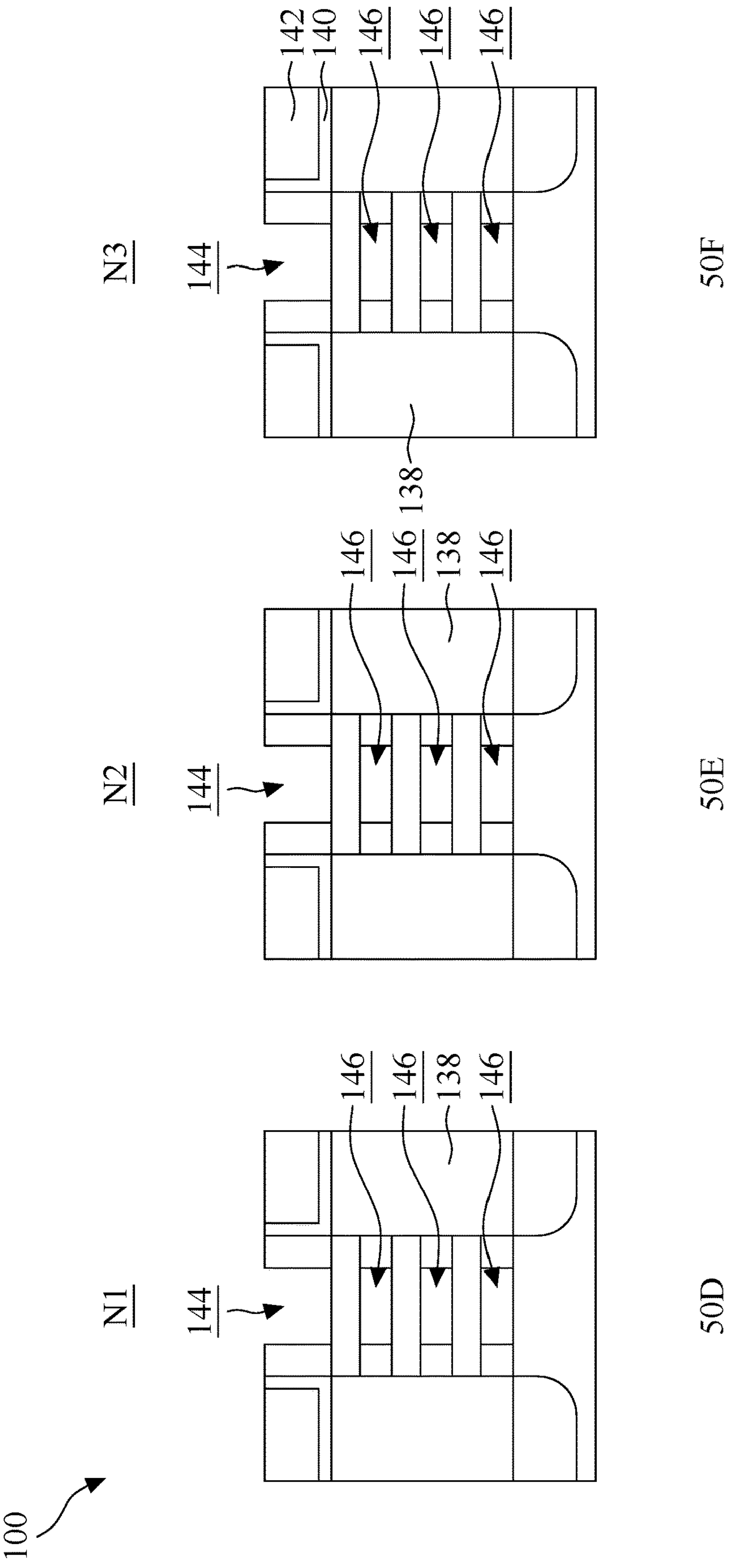

FIGS. 2K-1 and 2K-2 and illustrate a semiconductor structure 100 after the formation of gate trenches 144 and gaps 146, in accordance with some embodiments.

The dummy gate structure 112 is removed using one or more etching processes (e.g., an anisotropic etching process such as dry plasma etching, an isotropic etching process such as dry chemical etching, remote plasma etching or wet chemical etching, and/or a combination thereof) to form gate trench 144 between the gate spacer layers 118, as shown in FIGS. 2K-1 and 2K-2, in accordance with some embodiments. In some embodiments, the gate trench 144 exposes the channel regions of the fin structures 104. In some embodiments, the gate trench 144 also exposes the sidewalls of the gate spacer layers 118 facing the channel regions.

Afterward, an etching process is performed to remove the first semiconductor layers 106 of the fin structures 104 to form gaps 146, as shown in FIGS. 2K-1 and 2K-2, in accordance with some embodiments. The etching process may be an anisotropic etching process such as dry plasma etching, an isotropic etching process such as dry chemical etching, remote plasma etching or wet chemical etching, and/or a combination thereof. The inner spacer layers 124 may be used as an etching stop layer in the etching process, which may protect the source/drain features 134 and 138 from being damaged. In some embodiments, the gaps 146 also expose the sidewalls of the inner spacer layers 124 facing the channel regions.

After the etching process, the four main surfaces (a top surface, a bottom surface and two side surfaces (not shown)) of the second semiconductor layers 108 are exposed, in accordance with some embodiments. The exposed second semiconductor layers 108 serve as nanostructures that function as channel layers of the resulting semiconductor device (e.g., nanostructure transistors such as GAA FET), in accordance with some embodiments.

Figures 1, 2L:
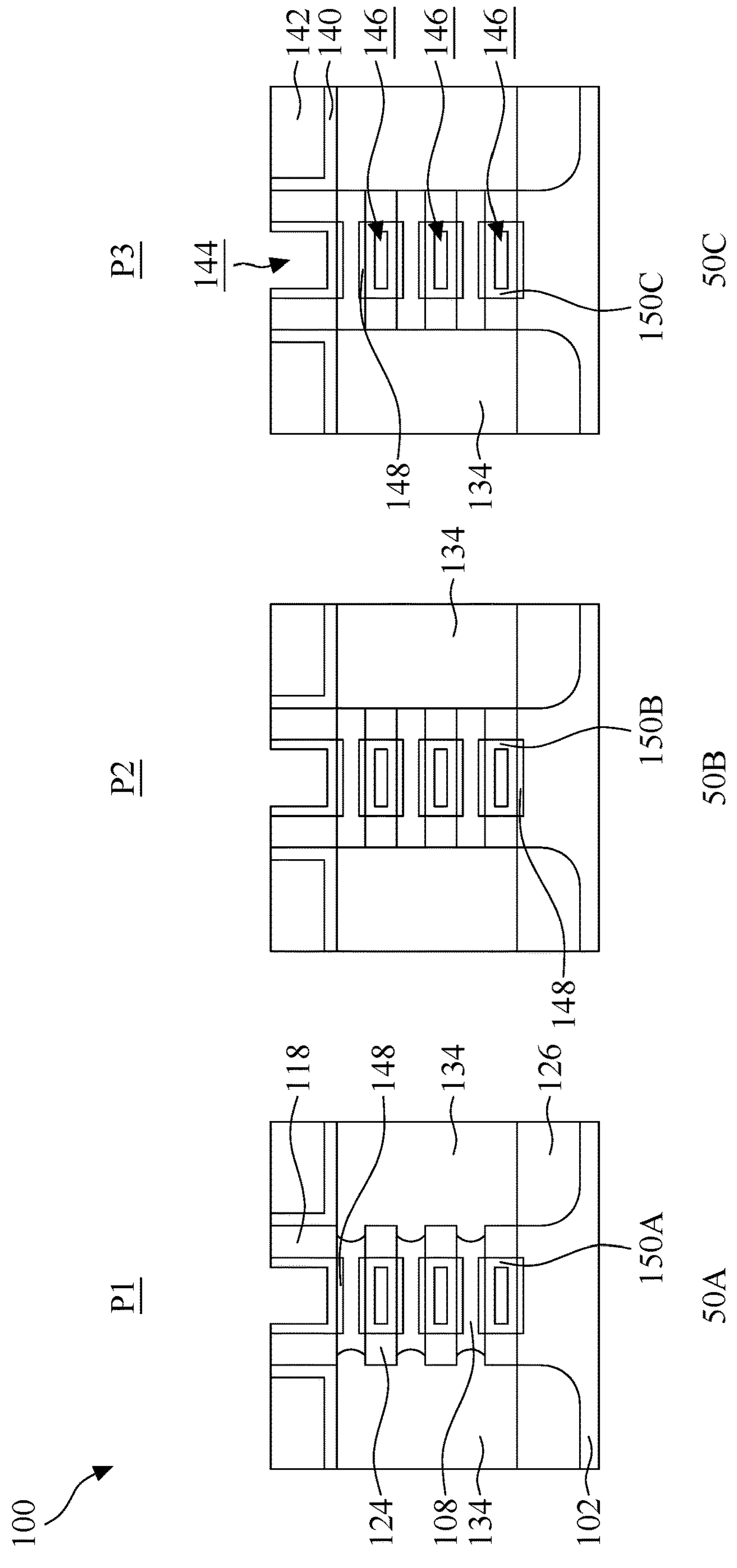
Figures 2, 2L:
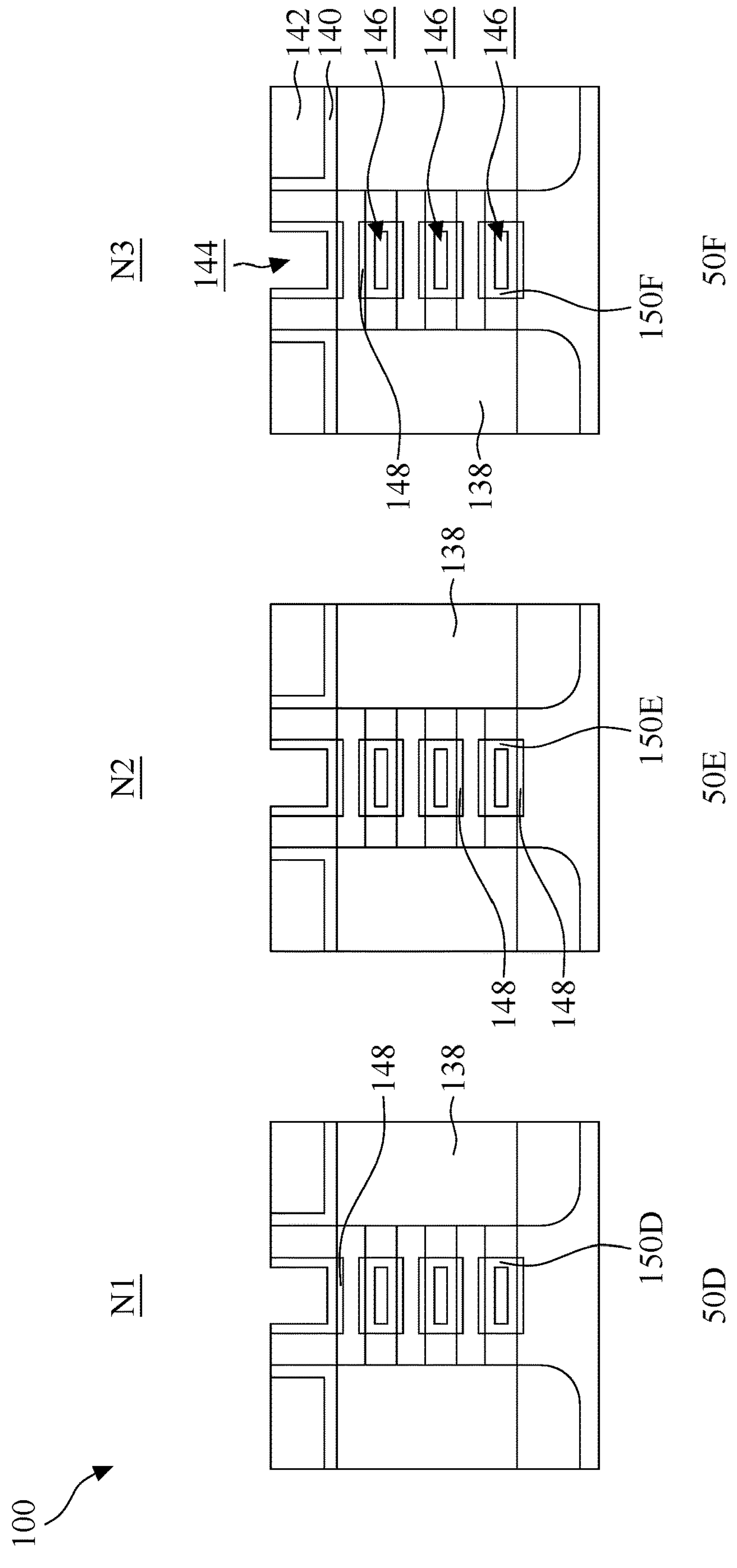
Figures 1, 2M:
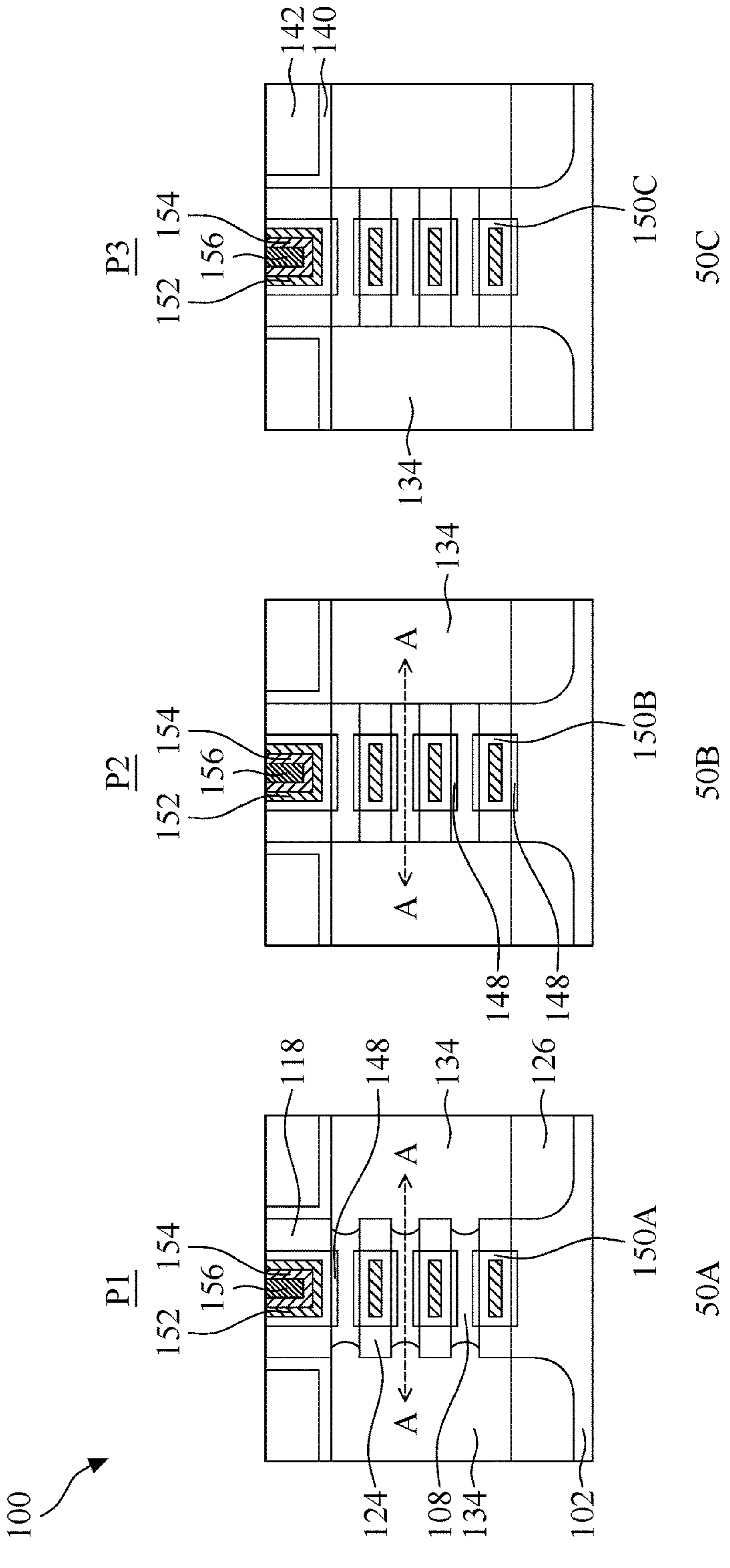
Figures 2, 2M:
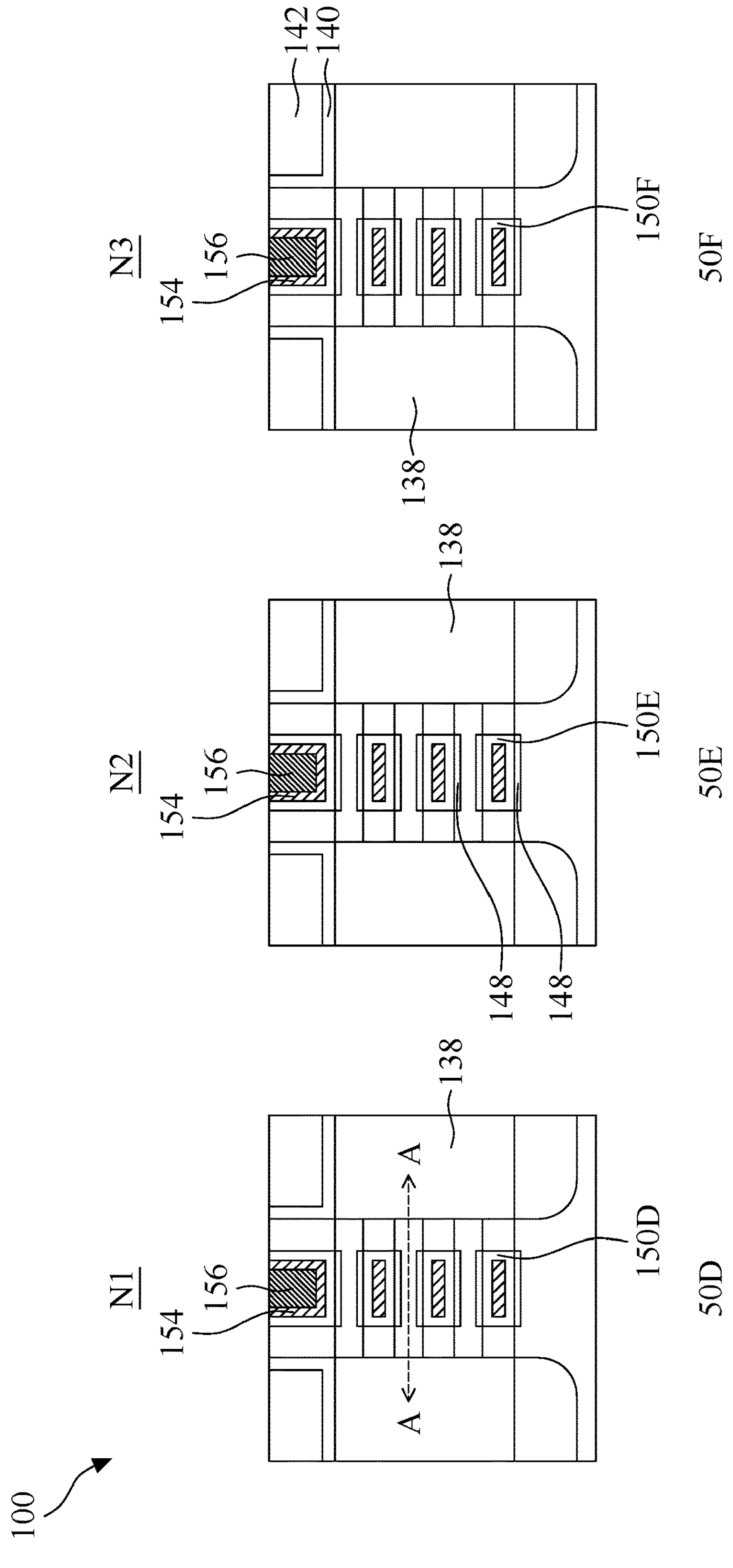
Figures 2, 2M, 3:
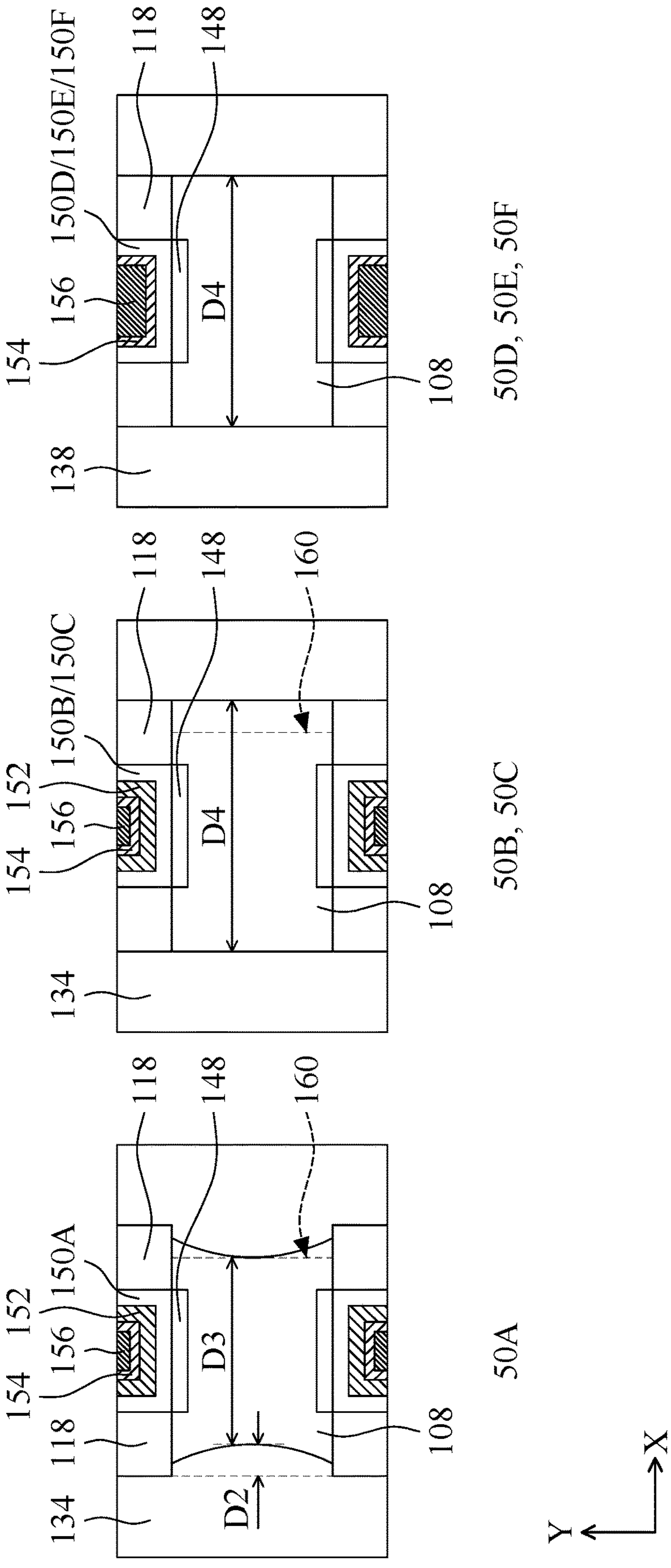

FIGS. 2L-1 and 2L-2 illustrate a semiconductor structure 100 after the formation of an interfacial layer 148 and a gate dielectric layer 150, in accordance with some embodiments.

The interfacial layer 148 is formed on the exposed surfaces of the nanostructures 108 and the exposed surfaces of the lower fin elements 104L, as shown in FIGS. 2L-1 and 2L-2, in accordance with some embodiments. The interfacial layer 148 wraps around the nanostructures 108, in accordance with some embodiments. In some embodiments, the interfacial layer 148 is made of a chemically formed silicon oxide. In some embodiments, the interfacial layer 158 is nitrogen-doped silicon oxide.

In some embodiments, the interfacial layer 148 is formed using one or more cleaning processes such as including ozone (03), ammonia hydroxide-hydrogen peroxide-water mixture, and/or hydrochloric acid-hydrogen peroxide-water mixture. Semiconductor material from the nanostructures 108 and the lower fin elements 104L and 103P is oxidized to form the interfacial layer 148, in accordance with some embodiments.

A gate dielectric layer 150 is formed conformally along the semiconductor structure 100 and partially fills the gate trenches 144 and the gaps 146, as shown in FIGS. 2L-1 and 2L-2, in accordance with some embodiments. In some embodiments, the gate dielectric layers 150 in the device regions 50A-50F are denoted as gate dielectric layers 150A-150F, respectively. The gate dielectric layer 150 is formed on the interfacial layer 148 and wraps around the nanostructures 108, in accordance with some embodiments. The gate dielectric layer 150 is further formed along the sidewalls of the gate spacer layers 118 and the inner spacer layers 124 facing the channel regions, in accordance with some embodiments.

The gate dielectric layer 150 may be a high-k dielectric layer. In some embodiments, the high-k dielectric layer is made of a dielectric material with a high dielectric constant (k value); higher than 3.9, for example. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr)$TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

After the high-k dielectric layer for the gate dielectric layer 150 is formed, one or more dopant incorporation processes may be performed on the semiconductor structure 100, thereby doping or incorporating dopants (e.g., nitrogen, fluorine, oxygen, dipole elements such as aluminum, lanthanum, magnesium, titanium, zirconium, and/or another suitable dopant) into the gate dielectric layer 150 and/or the interfacial layer 148, in accordance with some embodiments. For example, variations of the dopant concentrations can lead to changes in the crystallographic structure of the gate dielectric layer (e.g., hafnium-based high-k dielectric layer), and form and/or boost the electric dipoles (e.g., n-type dipole and/or p-type dipole) in the gate dielectric layer 150 or at the interfaces between the gate dielectric layers and subsequently formed work function layers, which can tune spontaneous polarization and internal bias fields and result in variations of the threshold voltages of the resulting semiconductor devices.

In some embodiments, a dipole material (not shown) may be deposited on the first high-k dielectric layer 140 followed by a patterning process (e.g., including photolithography and etching processes). An anneal process is performed to drive the electric dipoles (e.g., n-type dipole and/or p-type dipole) from the dipole material into the gate dielectric layer 150, and then the dipole material is removed using an etching process. For example, n-type dipole materials may be lanthanum oxide ($La_2O_3$), yttrium oxide ($Y_2O_3$), titanium oxide ($TiO_2$), or another suitable material. P-type dipole materials may be germanium oxide, aluminum oxide, gallium oxide, zinc oxide, or another suitable material. The n-dipole materials serve to reduce the threshold voltage of n-type devices and/or increase the absolute value of the threshold voltage of p-type devices. The p-dipole material serves to reduce the absolute value of the threshold voltage of p-type devices and/or increase the threshold voltage of n-type devices. The concentration of the electric dipoles in the high-k dielectric layer 140 may be positively correlated with the thickness of the as-deposited dipole material.

In some embodiments where the n-type dipole material (e.g., La) is used, the gate dielectric layer 150C and gate dielectric layer 150D are highly doped, the gate dielectric layer 150B and the gate dielectric layer 150E are moderately doped, and the gate dielectric layers 150A and the gate dielectric layer 150F are lightly doped. In some embodiments, the dipole concentration (e.g., La concentration) of the gate dielectric layers 150A and 150F is less than the dipole concentration (e.g., La concentration) of the gate dielectric layers 150B and 150E, and the dipole concentration (e.g., La concentration) of the gate dielectric layers 150B and 150E is less than the dipole concentration (e.g., La concentration) of the gate dielectric layers 150C and 150D. In some other embodiments, the gate dielectric layer 150C and gate dielectric layer 150D are moderately doped, the gate dielectric layer 150B and the gate dielectric layer 150E are lightly doped, and the gate dielectric layers 150A and the gate dielectric layer 150F are non-doped.

As a result, for a semiconductor structure having various devices with different threshold voltages, by performing multiple sets of depositions of dipole material, patterning process and anneal process, it can be realized that the gate dielectric layer 150 of various devices have the electric dipoles with different concentrations, so various devices can have different threshold voltages.

FIGS. 2M-1 and 2M-2 illustrate a semiconductor structure 100 after the formation of metal gate electrode layers, in accordance with some embodiments. FIG. 2M-3 is a plan view corresponding to line A-A in FIGS. 2M-1 and 2M-2, in accordance with some embodiments of the disclosure.

A p-type work function layer 152 is formed over the gate dielectric layers 150A-150C in the p-type device regions 50A-50C, as shown in FIG. 2M-1, in accordance with some embodiments. The p-type work function layer 152 partially fills the gate trench 144 and overfills the gaps 146, in accordance with some embodiments. In some embodiments, the p-type work function layer 152 is p-type work function metal, e.g., TiN, WN, WCN, TaN, Ru, Co, W, another suitable p-type work function metal, or a combination thereof.

As used herein, the term "p-type work function metal (pWFM)" defines a metal or a metal-containing material with a work function that is closer to a valence band energy than a conduction band energy of a semiconductor material of a FET channel region. In some embodiments, the term "p-type work function metal (pWFM)" defines a metal or a metal-containing material with a work function that is equal to or greater than 4.5 eV.

In some embodiments, the p-type work function layer 152 is deposited over the semiconductor structure 100 using ALD, CVD, PVD, another suitable technique, or a combination thereof, and followed by a patterning process (including photolithography and etching processes) to remove the p-type work function layer 152 from the n-type device regions 50D-50F.

An n-type work function layer 154 is formed over the p-type work function layer 152 in the p-type device regions 50A-50C and over the gate dielectric layer 150D-150F in the n-type device regions 50D-50F, as shown in FIGS. 2M-1 and 2M-2, in accordance with some embodiments. The n-type work function layer 154 partially fills the gate trenches 144 and overfills the gaps 146 in the n-type device regions 50D-50F, in accordance with some embodiments. In some embodiments, the n-type work function layer 154 is n-type work function metal, e.g., Ti, Ag, Al, TiAl, TiAlN, TiAIC, TaAl, TaC, TaCN, TaSiN, TaAlC, Mn, Zr, another suitable n-type work function metal, or a combination thereof.

As used herein, the term "n-type work function metal (nWFM)" defines a metal or a metal-containing material with a work function that is closer to a conduction band energy than a valence band energy of semiconductor material of a FET channel region. In some embodiments, the term "n-type work function metal (nWFM)" defines a metal or a metal-containing material with a work function of less than 4.5 eV.

A gate metal fill layer 156 is formed on the n-type work function layer 154 to overfill the remainders of the gate trenches 144, as shown in FIGS. 2M-1 and 2M-2, in accordance with some embodiments. In some embodiments, the gate metal fill layer 156 is made of metal material with lower resistance, for example, tungsten (W), titanium (Ti), silver (Ag), ruthenium (Ru), molybdenum (Mo), copper (Cu), cobalt (Co), Al, iridium (Ir), nickel (Ni), metal alloys, and a combination thereof. In some embodiments, the gate metal fill layer 156 is formed using ALD, CVD, PVD, electroplating process, another suitable technique, or a combination thereof.

In the n-type device regions 50A-50C, the p-type work function layer 152, the n-type work function layer 154 and the gate metal fill layer 156 are collectively used as the metal gate electrode layer of the p-type transistors P1, P2 and P3. In the n-type device regions 50D-50F, the n-type work function layer 154 and the gate metal fill layer 156 are collectively used as the metal gate electrode layer of the n-type transistors N1, N2 and N3.

A planarization process such as CMP may be performed on the semiconductor structure 100 to remove the gate dielectric layer 150 and the metal gate electrode materials formed above the upper surface of the interlayer dielectric layer 142, in accordance with some embodiments. After the planarization process, the upper surfaces of the metal gate electrode layer, the gate spacer layers 118 and the interlayer dielectric layer 142 are substantially coplanar, in accordance with some embodiments.

The interfacial layer 148, the gate dielectric layer 150 and the metal gate electrode layer combine to form final gate stacks, in accordance with some embodiments. In some embodiments, the final gate stack extends in the Y direction (as shown in FIG. 1). That is, the final gate stack has a longitudinal axis parallel to the Y direction, in accordance with some embodiments.

In device region 50A, the final gate stack combines with the source/drain features 134 to form the p-type transistor P1. In device region 50B, the final gate stack combines with the source/drain features 134 to form the p-type transistor P2. In device region 50C, the final gate stack combines with the source/drain features 134 to form the p-type transistor P3.

In device region 50D, the final gate stack combines with the source/drain features 138 to form the n-type transistor N1. In device region 50E, the final gate stack combines with the source/drain features 138 to form the n-type transistor N2. In device region 50F, the final gate stack combines with the source/drain features 138 to form the N-type transistor N3.

In accordance with some embodiments of the present disclosure, the EPI proximity push process is selectively performed on the p-type transistor P1 with ultra-low threshold voltage while the p-type transistor P2 with low threshold voltage and the p-type transistor P3 with standard threshold voltage are not subjected to the EPI proximity push process. Therefore, the on-state current of the p-type transistor P1 may be improved, while maintaining the power saving of the p-type transistors P2 and P3.

In some embodiments where the source/drain features 134 are doped with boron, measuring the boron signal in the semiconductor material (e.g., nanostructure or source/drain epitaxial material) at a position 160 that is aligned to the mid-thick of the gate spacer layer 118 (or inner spacer layer 124), the p-type transistor P1 has a boron concentration of from about $1\times10^{20}$ $cm^{-3}$ to about $5\times10^{21}$ $cm^{-3}$, and the p-type transistors P2 and P3 have a boron concentration of less than $1\times10^{19}$ $cm^{-3}$. As a result, the source/drain junction of the p-type transistor P1 is pushed closer to the channel region than the source/drain junction of the p-type transistors P2 and P3.

It is understood that the semiconductor structure 100 may undergo further CMOS processes to form various features over the semiconductor structure 100, such as contact plugs, vias, lines, inter metal dielectric layers, passivation layers, etc.

FIGS. 3A-1, 3A-2, 3B-1 and 3B-2 are cross-sectional views illustrating the formation of a semiconductor structure 200 at various intermediate stages, in accordance with some embodiments of the disclosure. The embodiments of FIGS. 3A-1 through 3B-2 are similar to the embodiments of FIGS. 2A through 2M-2 except that the p-type transistor P2 is also subjected to the EPI proximity push process.

Figures 1, 3A:
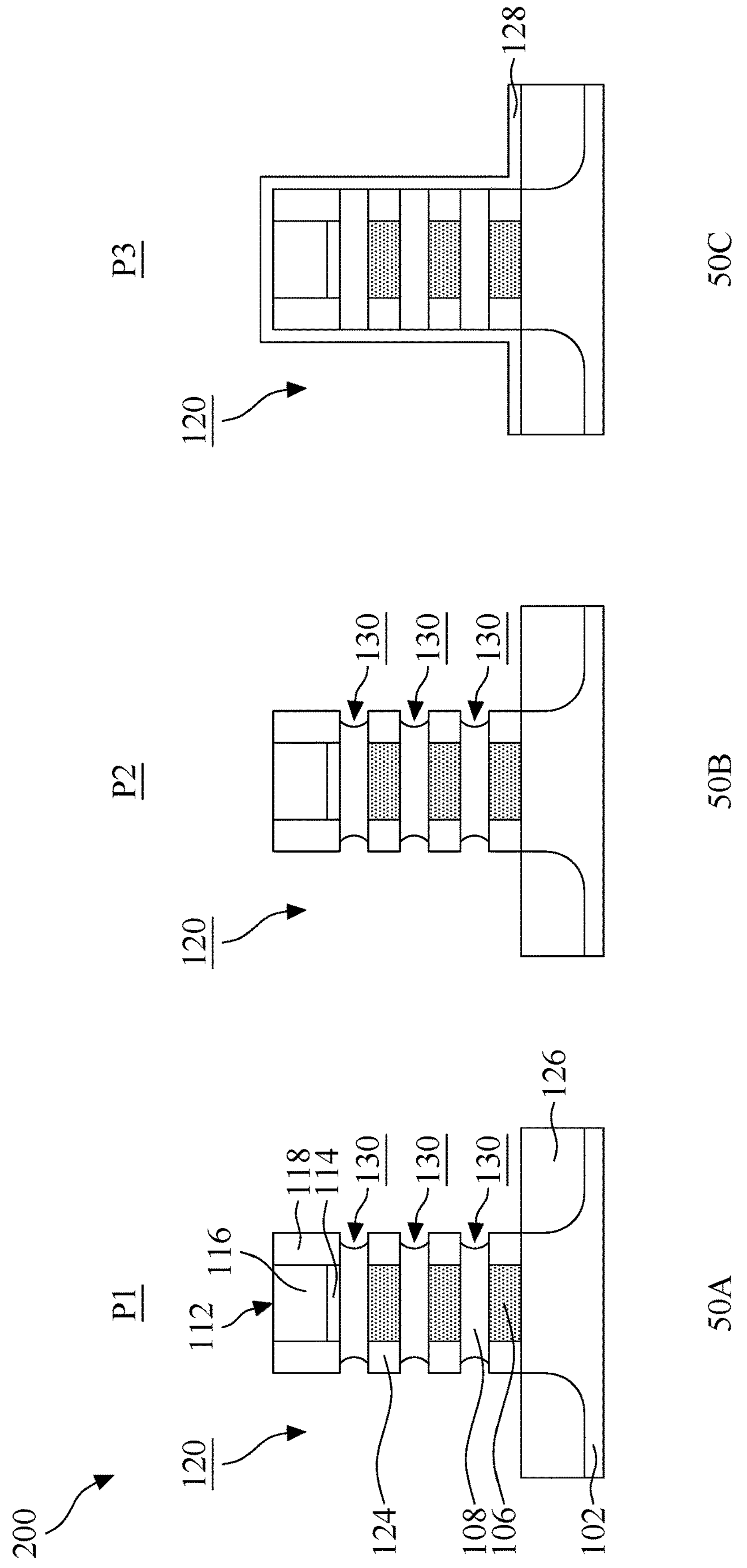
Figures 2, 3A:
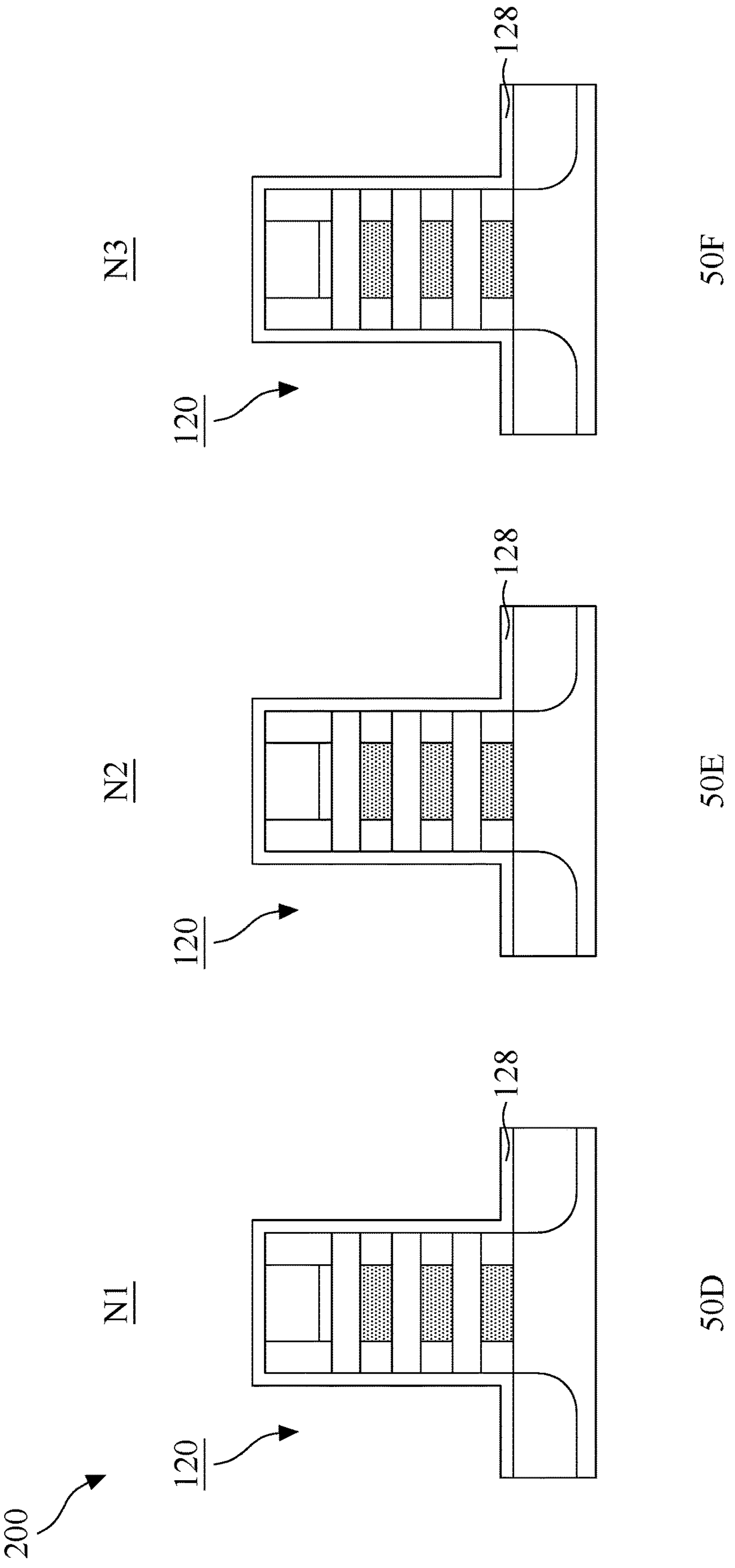

FIGS. 3A-1 and 3A-2 illustrate a semiconductor structure 200 after the formation of notches 130, in accordance with some embodiments. In some embodiments, the p-type transistor P2 may focus more on high on-state current than power saving.

Continuing from FIG. 2F, a patterned mask layer 128 is formed to cover the semiconductor structure 200 in the device regions 50C-50F, as shown in FIGS. 3A-1 and 3A-2, in accordance with some embodiments. The semiconductor structure 200 in the device regions 50A and 50B is exposed from the patterned mask layer 128, in accordance with some embodiments. An etching process is performed to laterally recess, from the source/drain recesses 120 toward the channel region, the second semiconductor layers 108 of the fin structures 104 in the device regions 50A and 50B to form notches 130, as shown in FIGS. 3A-1 and 3A-2, in accordance with some embodiments.

Figures 1, 3B:
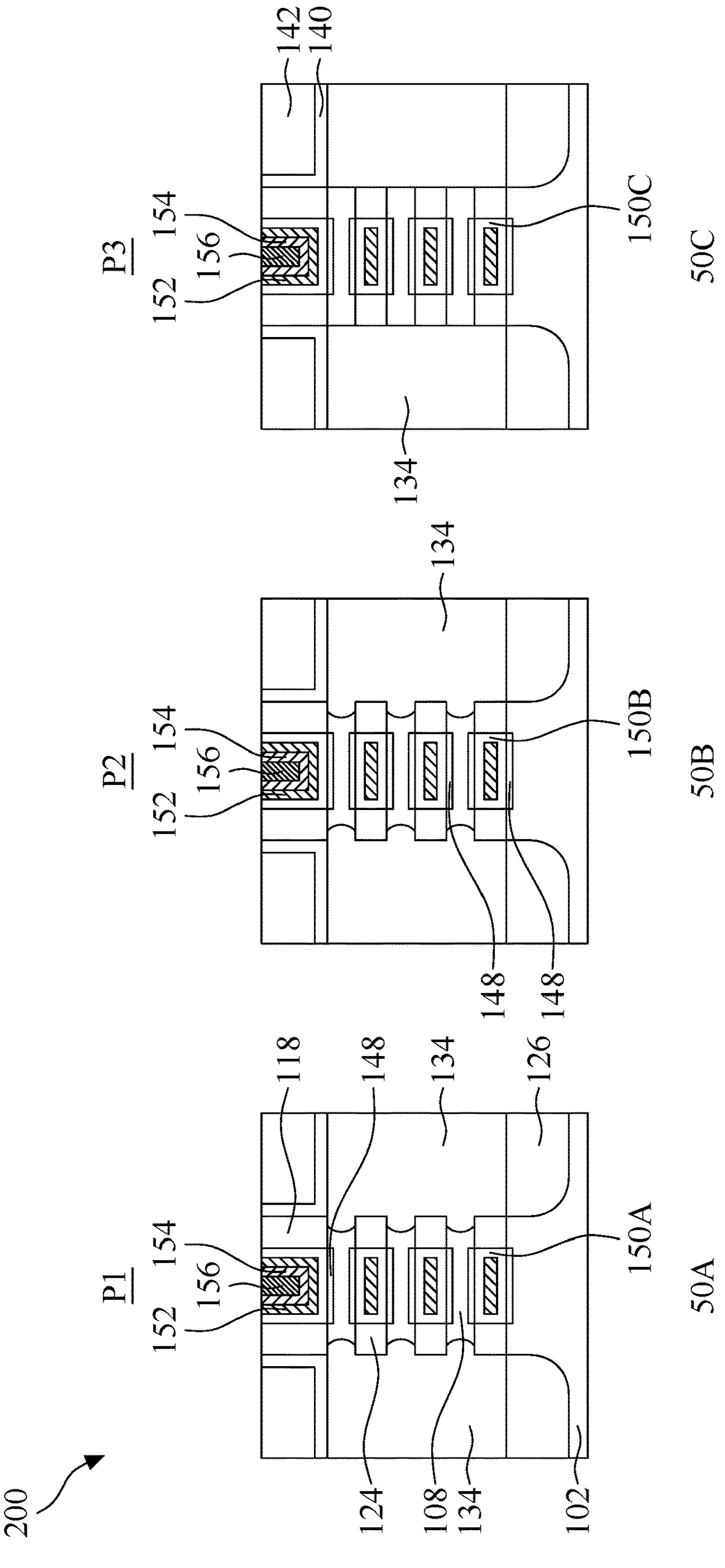
Figures 2, 3B:
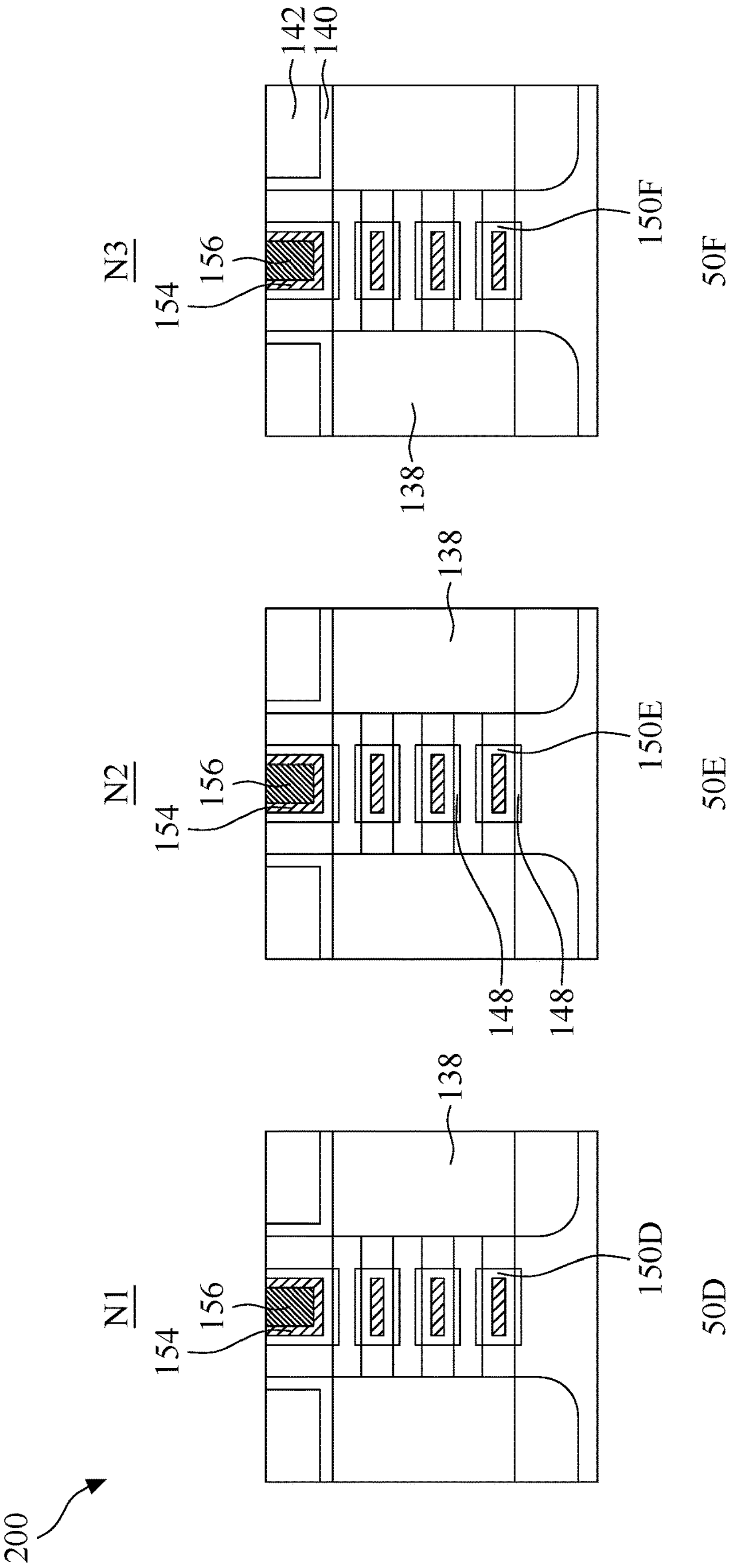

FIGS. 3B-1 and 3B-2 illustrate a semiconductor structure 200 after the formation of metal gate electrode layers, in accordance with some embodiments.

The steps discussed above in FIGS. 2H-1 through 2M-2 are performed, thereby forming the source/drain features 134 and 138, the contact etching stop layer 140, the interlayer dielectric layer 142 and the final gate stacks, as shown in FIGS. 3B-1 and 3B-2, in accordance with some embodiments.

FIGS. 4A-1, 4A-2, 4B-1 and 4B-2 are cross-sectional views illustrating the formation of a semiconductor structure 300 at various intermediate stages, in accordance with some embodiments of the disclosure. The embodiments of FIGS. 4A-1 through 4B-2 are similar to the embodiments of FIGS. 2A through 2M-2 except that the p-type transistor P2 is also subjected to the EPI proximity push process.

Figures 1, 4A:
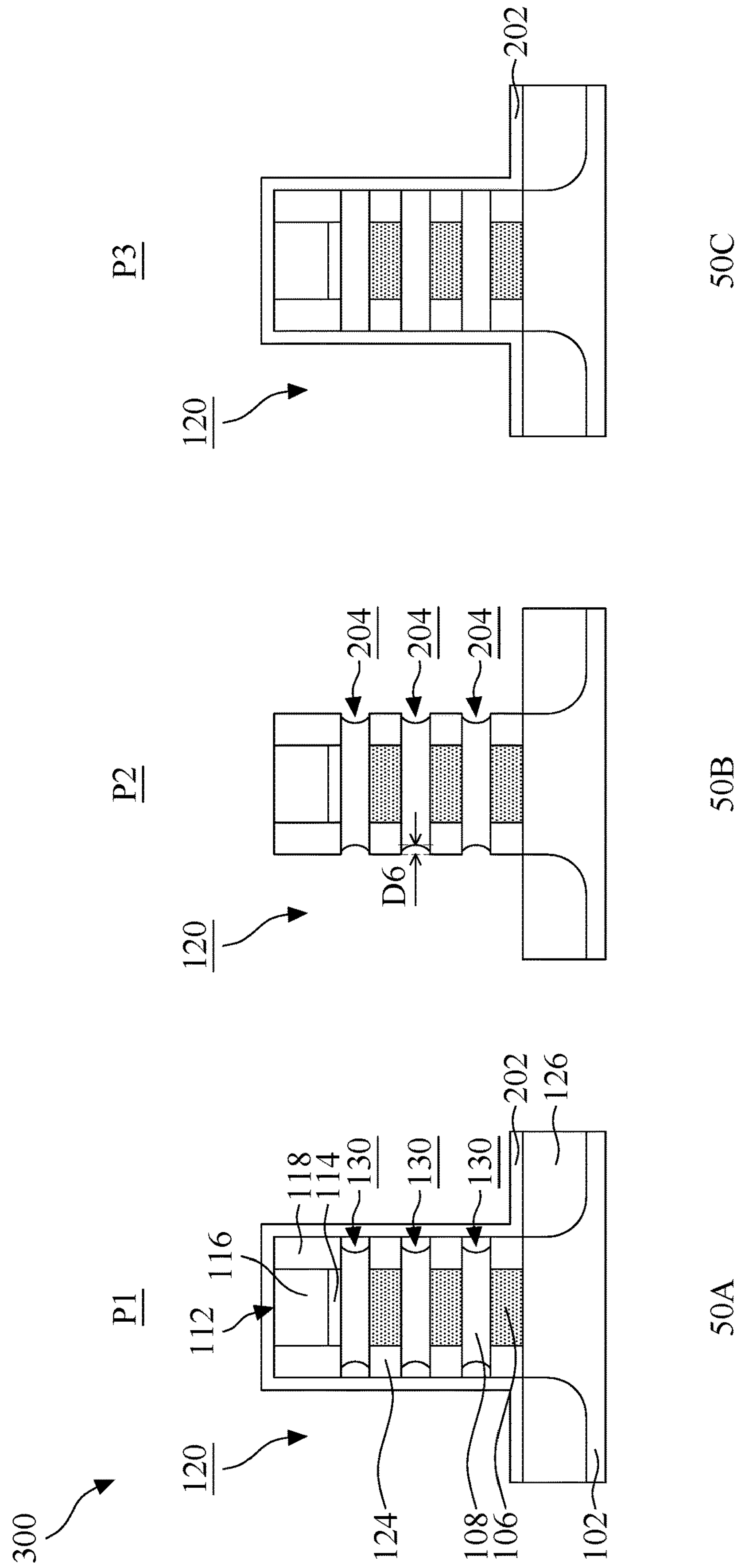
Figures 2, 4A:
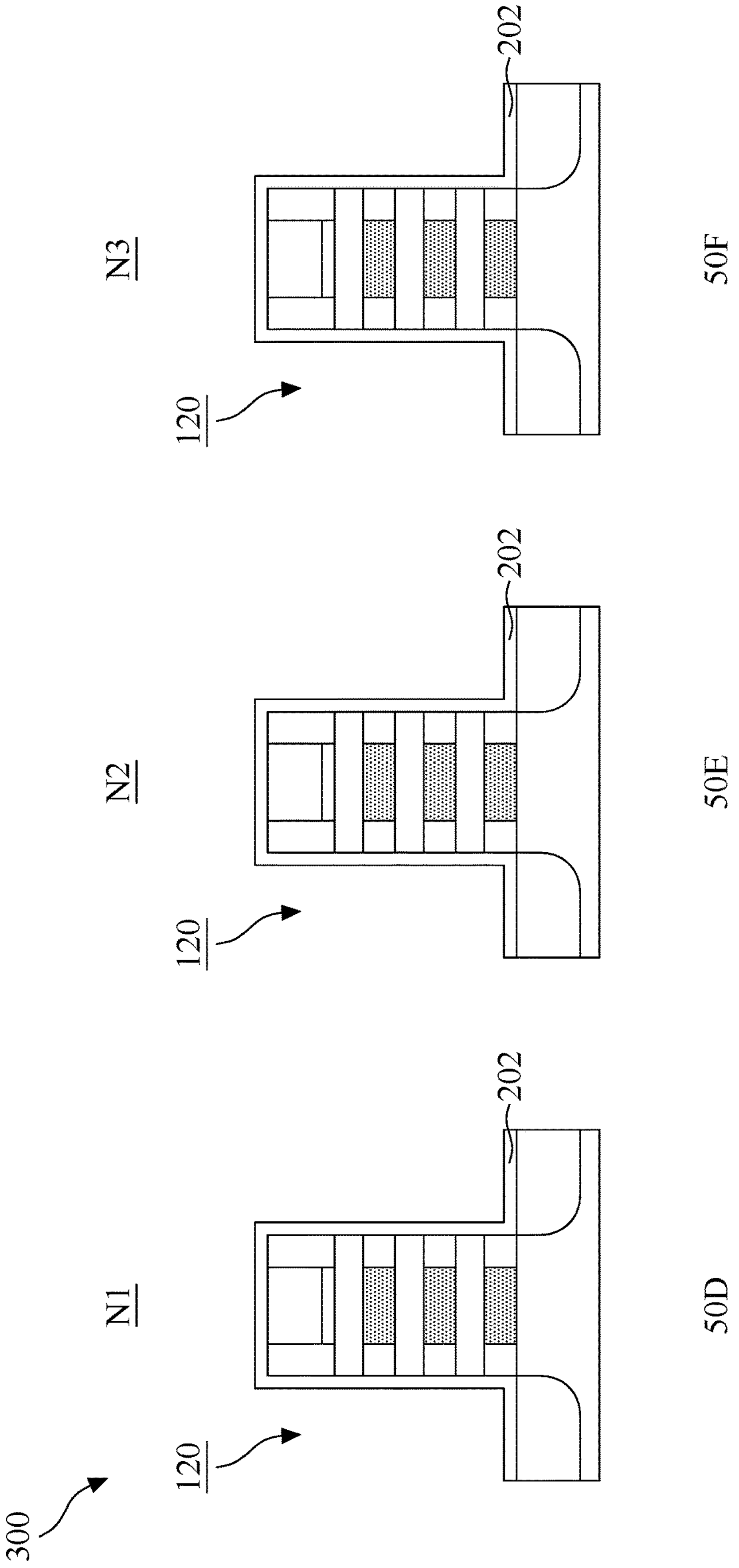

FIGS. 4A-1 and 4A-2 illustrate a semiconductor structure 300 after the formation of notches 204, in accordance with some embodiments.

Continuing from FIG. 2G, a patterned mask layer 202 is formed to cover the semiconductor structure 300 in the device regions 50A and 50C-50F, as shown in FIGS. 4A-1 and 4A-2, in accordance with some embodiments. In some embodiments, the material and the formation method of the patterned mask layer 202 may be the same as or similar to the material and the formation method of the patterned mask layer 128. The semiconductor structure 300 in the device region 50B is exposed from the patterned mask layer 202, in accordance with some embodiments.

An etching process is performed to laterally recess, from the source/drain recesses 120 toward the channel region, the second semiconductor layers 108 of the fin structure 104 in the device region 50B to form notches 204, as shown in FIGS. 4A-1 and 4A-2, in accordance with some embodiments. In some embodiments, the notches 204 in the device region 50B have the maximum dimension (recessing depths) D6 that is less than the dimension D2 (FIG. 2I-3) of the notches 130 in the device region 50A. Afterwards, the patterned mask layer 202 is removed using an etching process (e.g., a dry chemical etching, and/or a wet etching).

Figures 1, 4B:
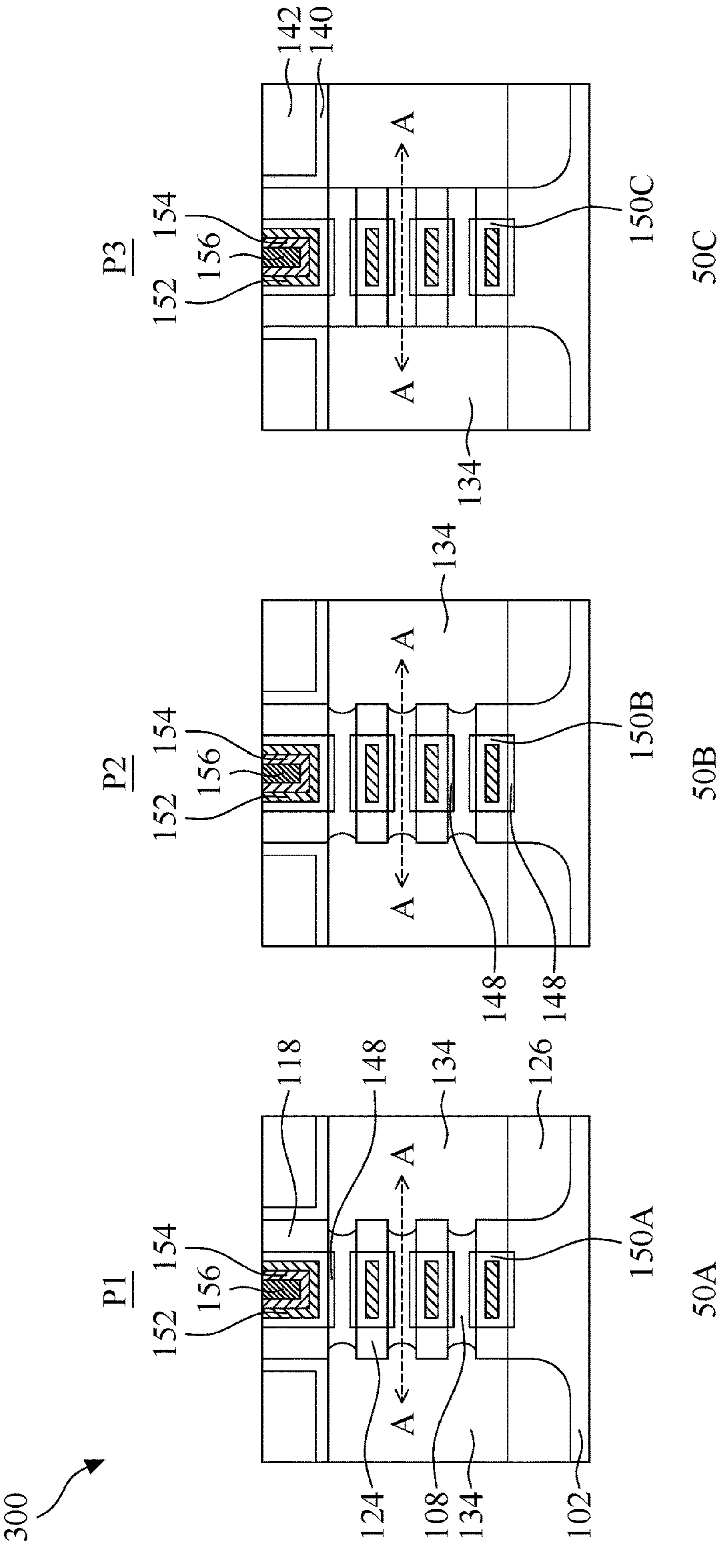
Figures 2, 4B:
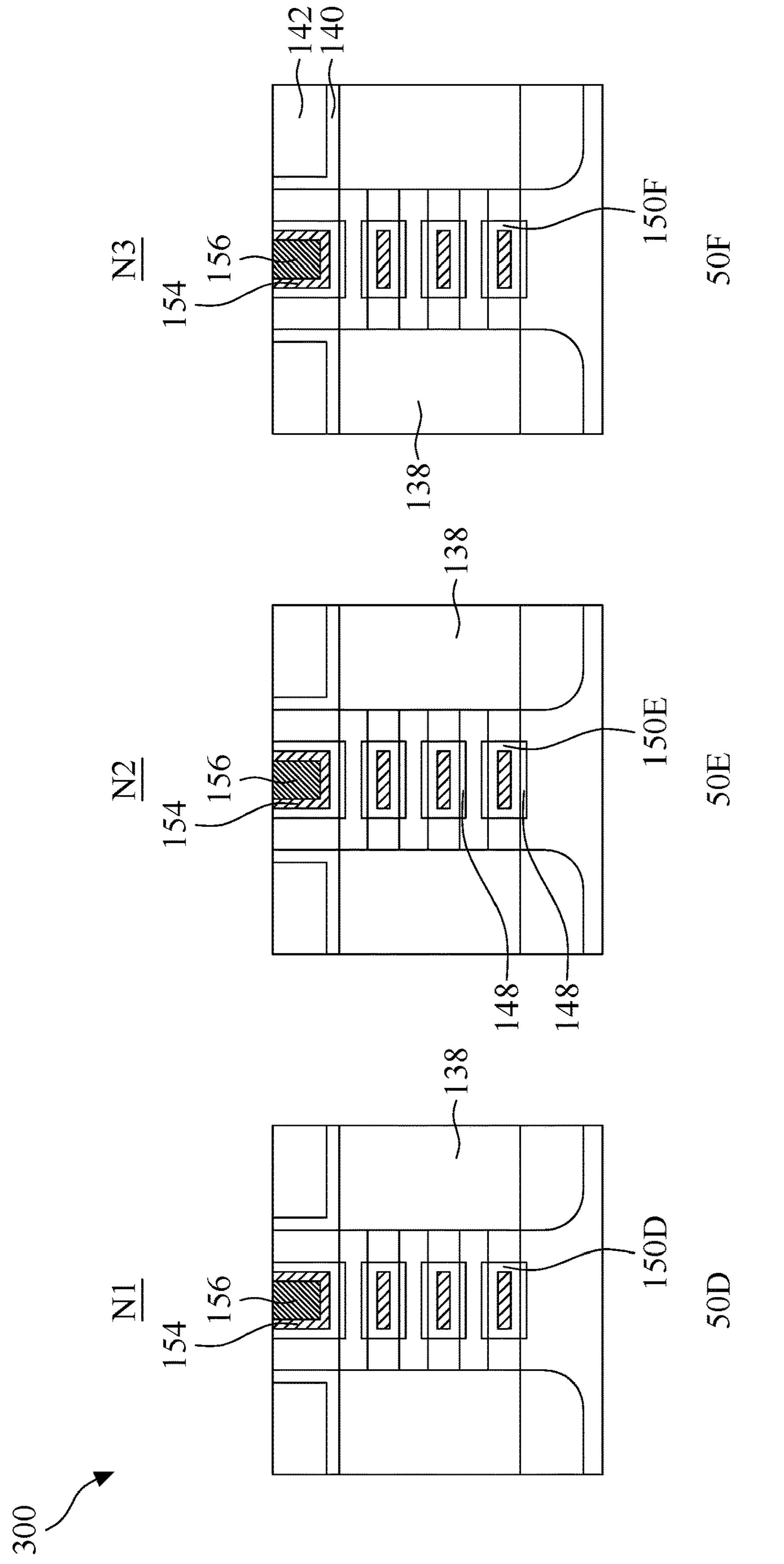
Figures 3, 4B:
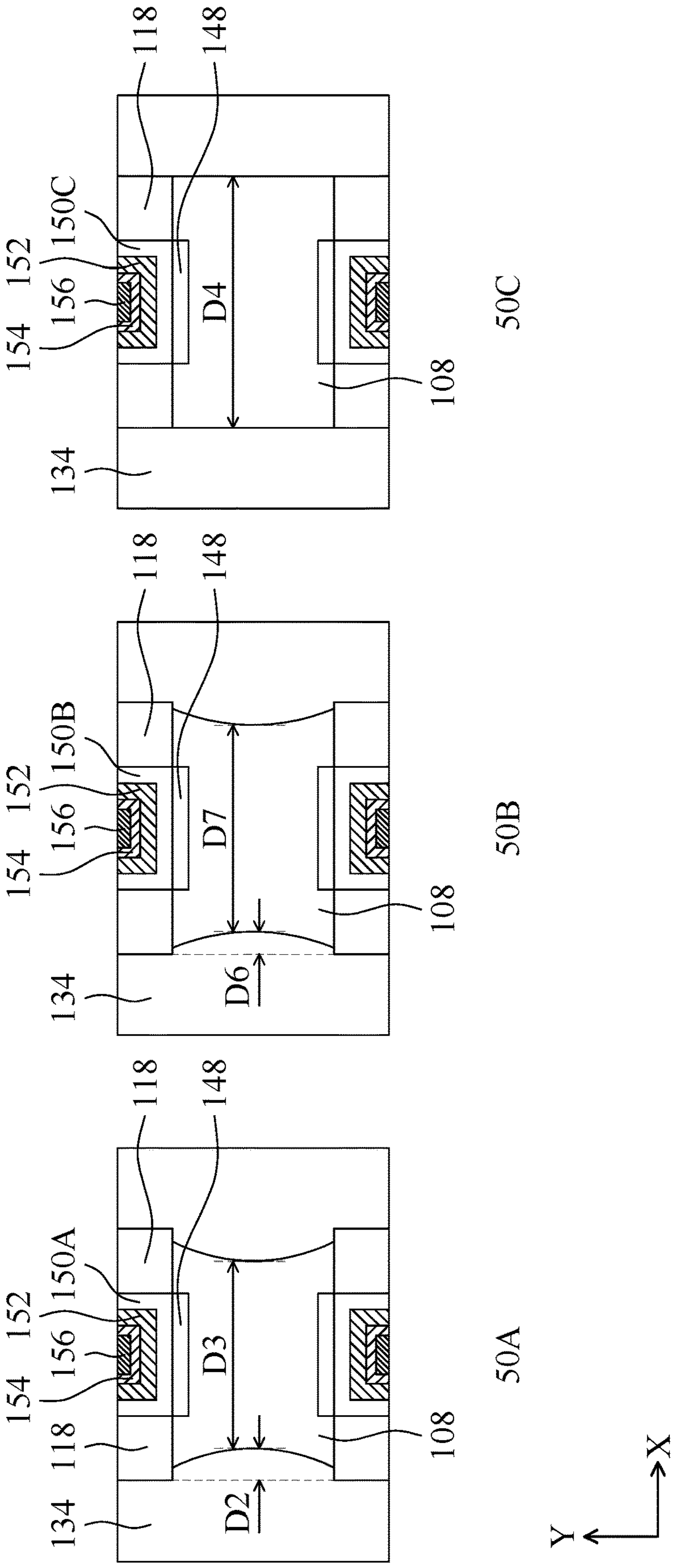

FIGS. 4B-1 and 4B-2 illustrate a semiconductor structure 300 after the formation of metal gate electrode layers, in accordance with some embodiments. FIG. 4B-3 is a plan view corresponding to line A-A in FIGS. 4B-1 and 4B-2, in accordance with some embodiments of the disclosure.

The steps discussed above in FIGS. 2H-1 through 2M-2 are performed, thereby forming the source/drain features 134 and 138, the contact etching stop layer 140, the interlayer dielectric layer 142 and the final gate stacks, as shown in FIGS. 4B-1 and 4B-2, in accordance with some embodiments. In some embodiments, the source/drain features 134 fill the notches 204 in the device region 50B. In some embodiments, the nanostructure 108 in the device region 50B has a dimension D7 that is greater than the dimension D3 of the nanostructure 108 in the device region 50A and less than the dimension D4 of the nanostructure 108 in the device region 50C.

Figures 1, 5:
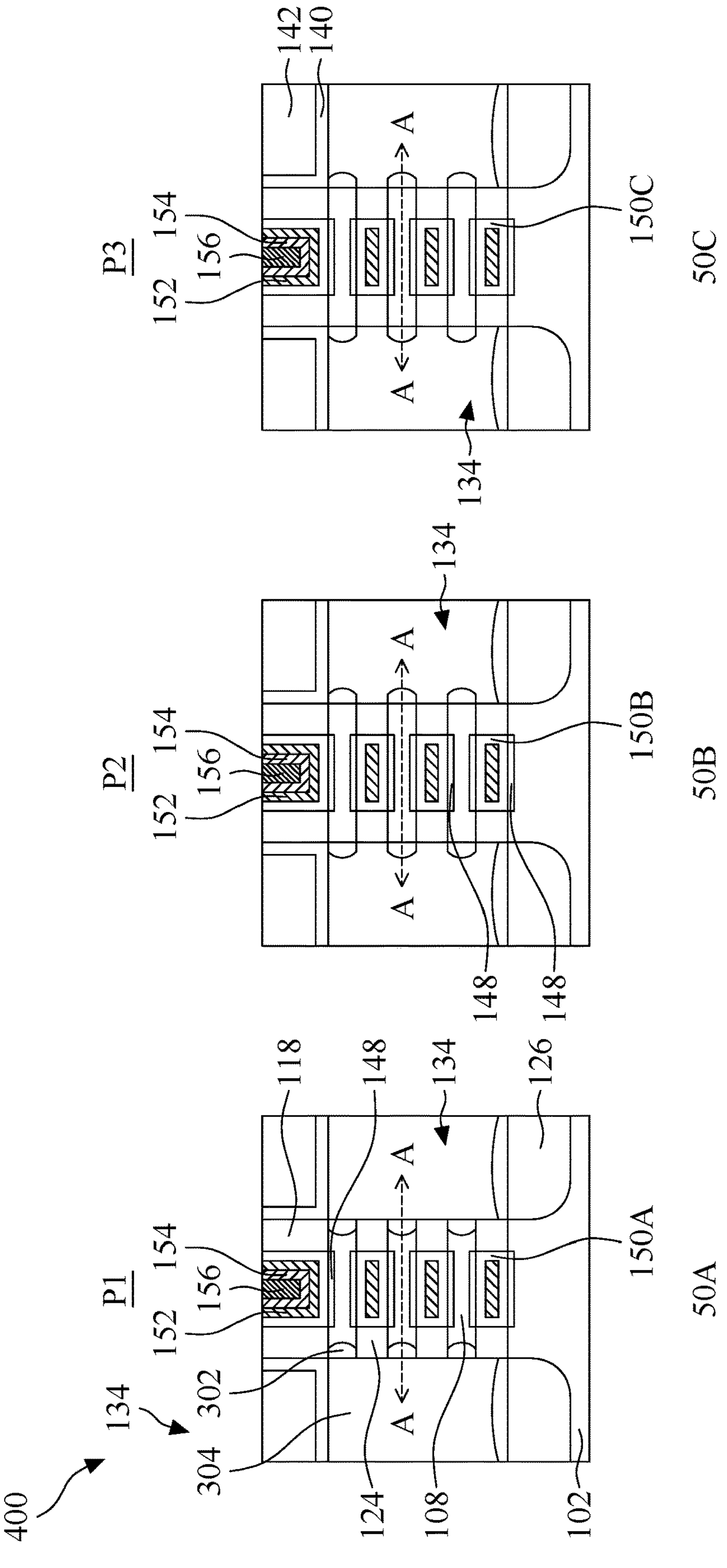
Figures 2, 5:
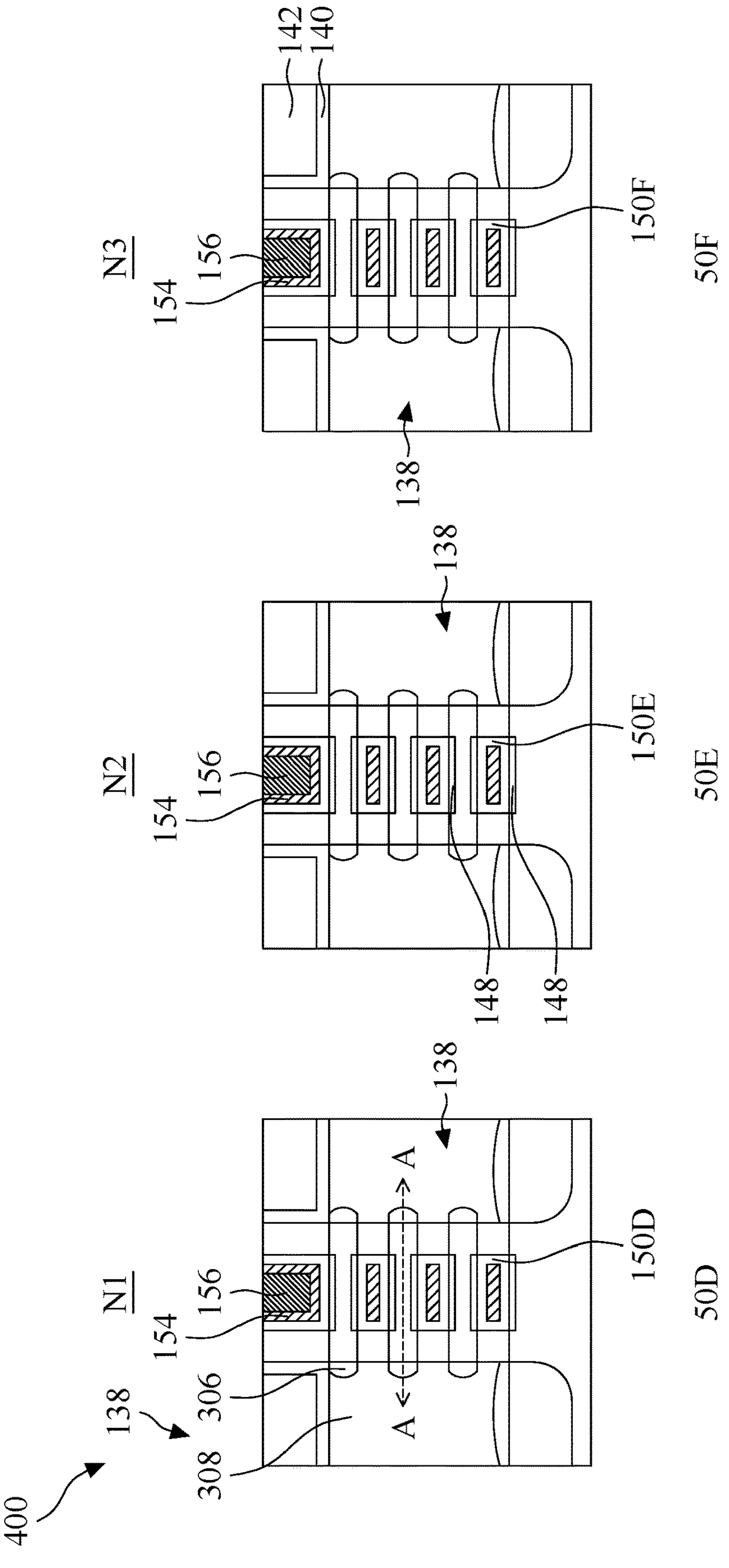
Figures 3, 5:
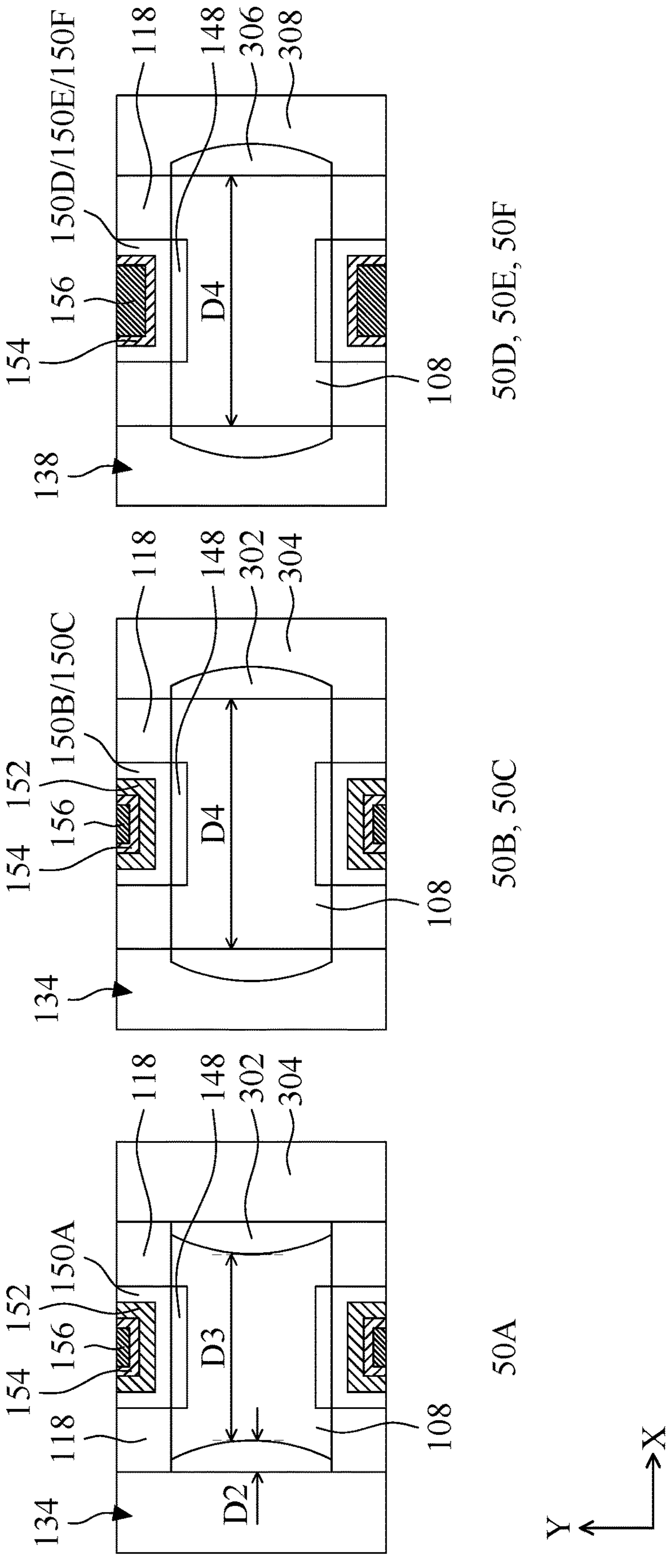

FIGS. 5-1 and 5-2 are cross-sectional views of a semiconductor structure 400, in accordance with some embodiments of the disclosure. The embodiments of FIGS. 5-1 and 5-2 are similar to the embodiments of FIGS. 2M-1 and 2M-2 except that the source/drain feature is a bi-layered structure. FIG. 5-3 is a plan view corresponding to line A-A in FIGS. 5-1 and 5-2, in accordance with some embodiments of the disclosure.

In some embodiments, the p-type source/drain features 134 may be multilayered structures, e.g., including sequentially formed barrier layer 302 and bulk layer 304. In some embodiments, the concentration of the dopant in the bulk layer 304 is higher than the concentration of the dopant in the barrier layer 302, e.g., by 1-2 orders. In some embodiments, the barrier layer 302 of the source/drain features 134 in the device region 50A is filled into the notches 130 and in contact with the gate spacer layers 118 and the inner spacer layers 124.

In some embodiments, the n-type source/drain features 138 may be multilayered structures, e.g., including sequentially formed barrier layer 306 and bulk layer 308. In some embodiments, the concentration of the dopant in the bulk layer 308 is higher than the concentration of the dopant in the barrier layer 306, e.g., by 1-2 orders.

FIGS. 6A-1, 6A-2, 6B-1 and 6B-2 are cross-sectional views illustrating the formation of a semiconductor structure 500 at various intermediate stages, in accordance with some embodiments of the disclosure. The embodiments of FIGS. 6A-1 through 6B-2 are similar to the embodiments of FIGS. 2A through 2M-2 except that the n-type transistor N1 is also subjected to the EPI proximity push process.

Figures 1, 6A:
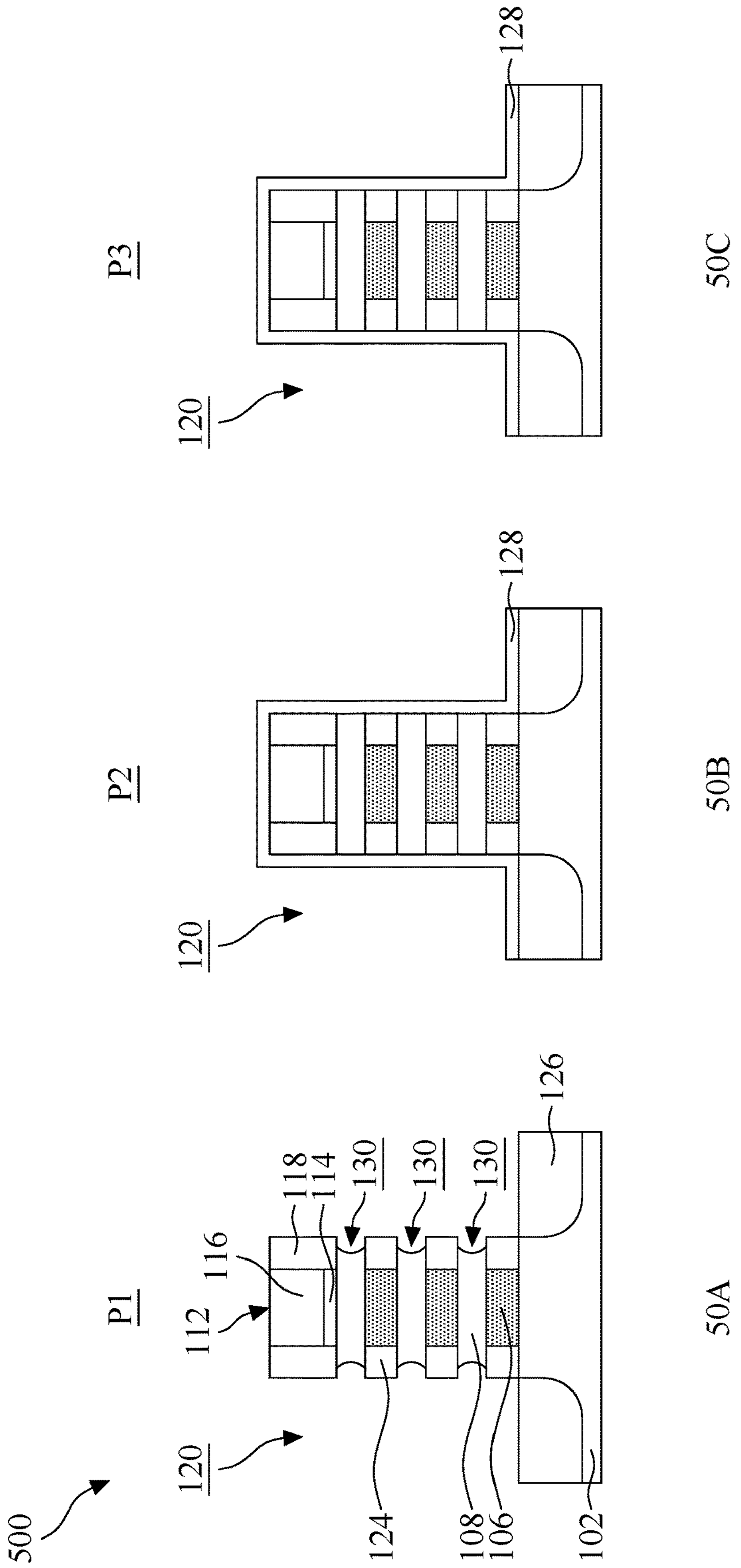
Figures 2, 6A:
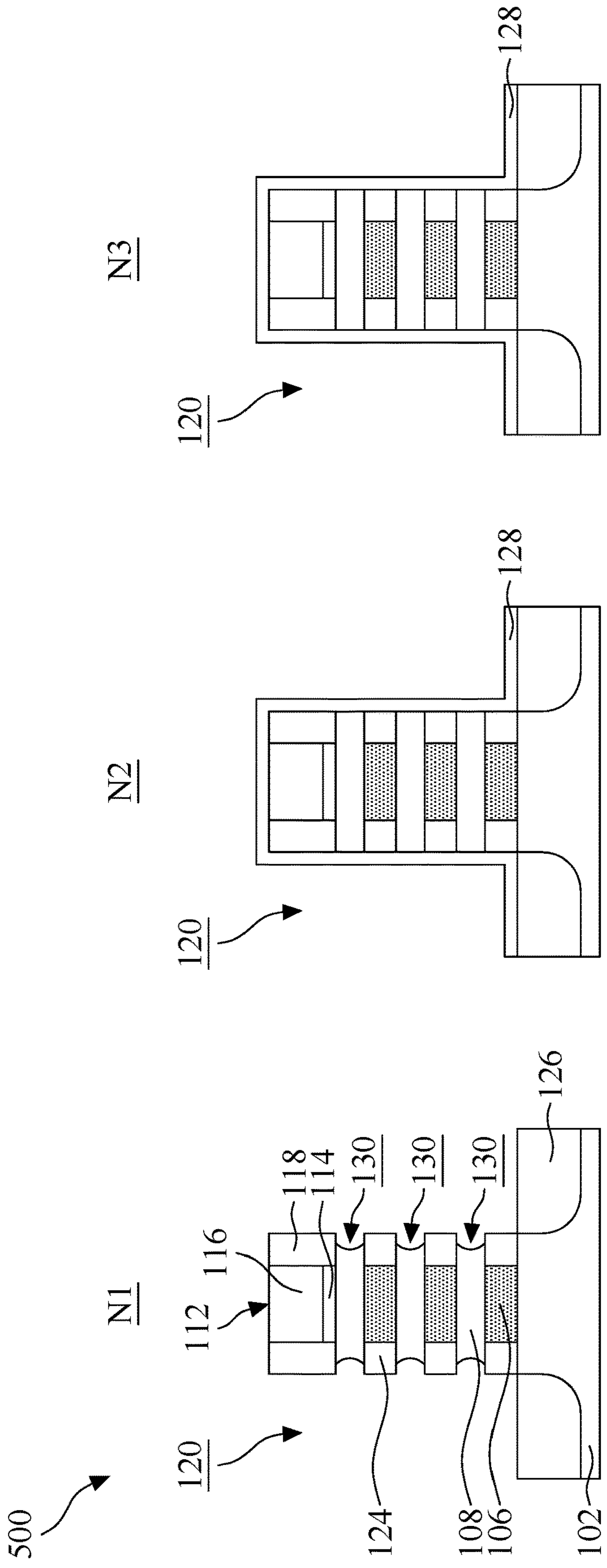

FIGS. 6A-1 and 6A-2 illustrate a semiconductor structure 500 after the formation of notches 130, in accordance with some embodiments. In some embodiments, the n-type transistor N1 may focus more on high on-state current than power saving.

Continuing from FIG. 2F, a patterned mask layer 128 is formed to cover the semiconductor structure 500 in the device regions 50B, 50C, 50E and 50F, as shown in FIGS. 6A-1 and 6A-2, in accordance with some embodiments. The semiconductor structure 500 in the device regions 50A and 50D is exposed from the patterned mask layer 128, in accordance with some embodiments. An etching process is performed to laterally recess, from the source/drain recesses 120 toward the channel region, the second semiconductor layers 108 of the fin structures 104 in the device regions 50A and 50D to form notches 130, as shown in FIGS. 6A-1 and 66A-2, in accordance with some embodiments.

Figures 1, 6B:
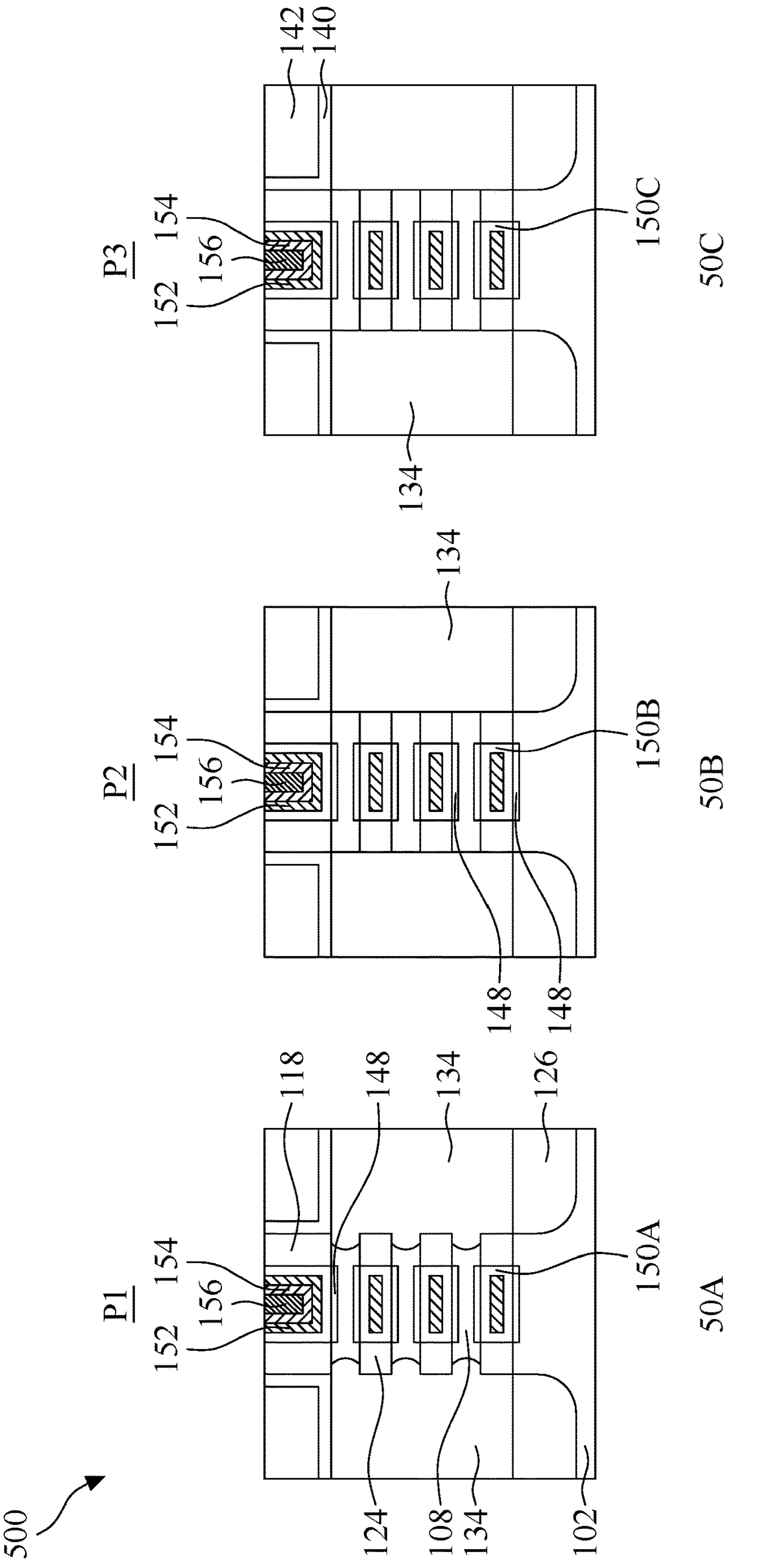
Figures 2, 6B:
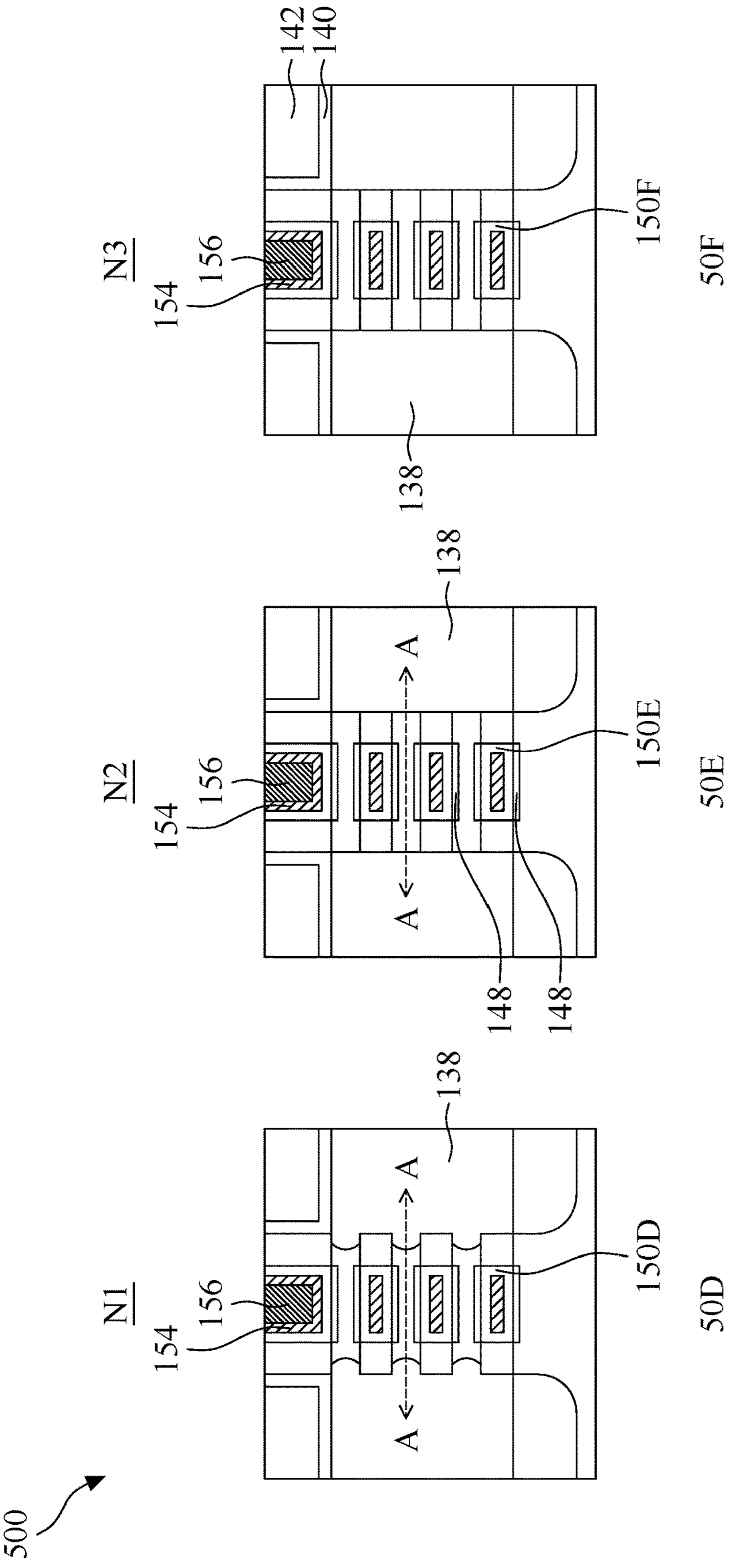
Figures 3, 6B:
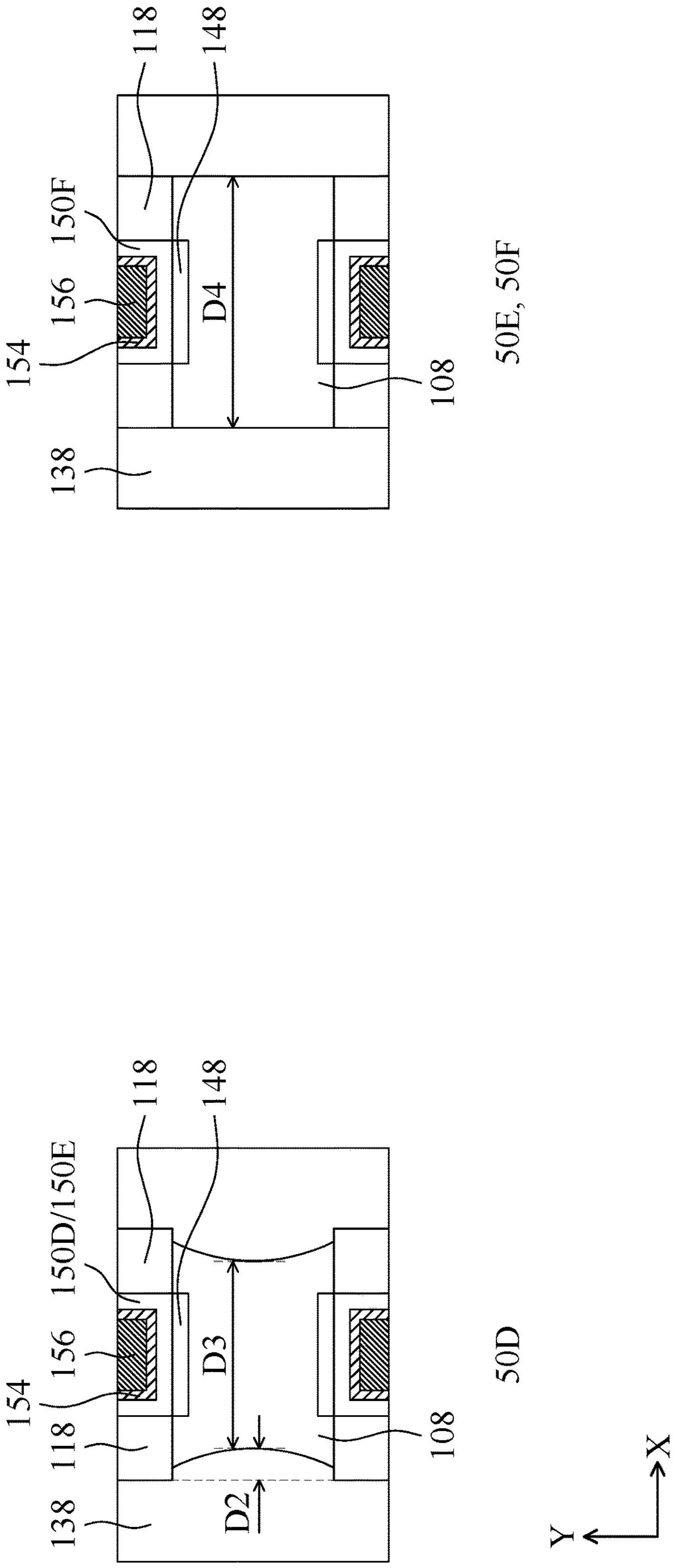

FIGS. 6B-1 and 6B-2 illustrate a semiconductor structure 500 after the formation of metal gate electrode layers, in accordance with some embodiments. FIG. 6B-3 is a plan view corresponding to line A-A in FIGS. 6B-2, in accordance with some embodiments of the disclosure.

The steps discussed above in FIGS. 2H-1 through 2M-2 are performed, thereby forming the source/drain features 134 and 138, the contact etching stop layer 140, the interlayer dielectric layer 142 and the final gate stacks, as shown in FIGS. 6B-1 and 6B-2, in accordance with some embodiments. In some embodiments, the source/drain features 138 fills the notches 130 in the device region 50D. In some embodiments, the second semiconductor layer 108 in the device region 50D has a dimension D3 that is less than the dimension D4 of the second semiconductor layers 108 in the device regions 50B, 50C, 50E and 50F.

As described above, the aspect of the present disclosure is directed to a semiconductor structure having various devices with different threshold voltages. The EPI proximity push process is selectively performed on the p-type transistor P1 with ultra-low threshold voltage while the p-type transistor P2 with low threshold voltage and the p-type transistor P3 with standard threshold voltage are not subjected to the EPI proximity push process. Therefore, the on-state current of the p-type transistor P1 may be improved, while maintaining the power saving of the p-type transistors P2 and P3.

Embodiments of a semiconductor structure and the method for forming the same may be provided. The semiconductor structure may include a first p-type transistor and a second p-type transistor. The p-type transistor has an ultra-low threshold voltage, and the second p-type transistor has a low or standard threshold voltage. An etching process is performed to push in the nanostructures of the first p-type transistor, while nanostructures of the second p-type transistor are covered by a patterned mask layer. As a result, the source/drain junction of the first p-type transistor is pushed closer to the channel region than the source/drain junction of the second p-type transistor. Therefore, the on-state current of the first p-type transistor may be improved, while maintaining the power saving of the second p-type transistor.

In some embodiments, a method for forming a semiconductor structure is provided. The method includes forming a first fin structure in a first p-type device region and a second fin structure in a second p-type device region. Each of the first fin structure and the second fin structure includes alternatingly stacking first semiconductor layers and second semiconductor layers. The method also includes etching the first fin structure and the second fin structure to form a first recess and a second recess, respectively, forming a first patterned mask layer to cover the second p-type device region, laterally recessing the second semiconductor layers of the first fin structure to form first notches, removing the first patterned mask layer, forming a first p-type source/drain feature in the first recess and the notches, and forming a second p-type source/drain feature in the second recess.

In some embodiments, a method for forming a semiconductor structure is provided. The method includes forming a stack in which first semiconductor layers and second semiconductor layers are alternatingly stacked over a substrate, patterning the stack to form a first fin structure, a second fin structure and a third fin structure, forming a first patterned mask layer to cover the second fin structure and the third fin structure, laterally recessing the second semiconductor layers of the first fin structure while the second fin structures and the third fin structure are covered by the first patterned mask layer, removing the first patterned mask layer, forming a second patterned mask layer to cover the third fin structure, forming a first epitaxial material with a first conductivity type on the first fin structure and the second fin structure, removing the second patterned mask layer, forming a third patterned mask layer to cover the first fin structure and the second fin structure, and forming a second epitaxial material with a second conductivity type on the third fin structure. The second conductivity type is opposite to the first conductivity type.

In some embodiments, a semiconductor structure is provided. The semiconductor structure includes a first p-type transistor with a first threshold voltage and a second p-type transistor with a second threshold voltage that is different than the first threshold voltage. The first p-type transistor includes a plurality of first nanostructures, first and second source/drain features adjoining the first nanostructures, and a first gate stack wrapping around the first nanostructures. The second p-type transistor includes a plurality of second nanostructures, third and fourth source/drain features adjoining the second nanostructures, and a second gate stack wrapping around the second nanostructures. A first distance between the first and second source/drain features is less than a second distance between the third and fourth source/drain features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a first fin structure in a first p-type device region and a second fin structure in a second p-type device region, wherein each of the first fin structure and the second fin structure includes alternatingly stacking first semiconductor layers and second semiconductor layers;

etching the first fin structure and the second fin structure to form a first recess and a second recess, respectively;

forming a first patterned mask layer to cover the second p-type device region;

laterally recessing the second semiconductor layers of the first fin structure to form first notches;

removing the first patterned mask layer;

forming a first p-type source/drain feature in the first recess and the notches; and forming a second p-type source/drain feature in the second recess.

2. The method for forming the semiconductor structure as claimed in claim 1, further comprising:

laterally recessing the first semiconductor layers of the first fin structure and the second fin structure to form second notches and third notches, respectively; and forming first inner spacer layers in the second notches and second inner spacer layers in the third notches.

3. The method for forming the semiconductor structure as claimed in claim 2, wherein in a direction parallel to a longitudinal axis of the first fin structure, a dimension of the first notches is less than a width of the first inner spacer layers.

4. The method for forming the semiconductor structure as claimed in claim 1, further comprising:

forming a second patterned mask layer to cover the first p-type device region;

laterally recessing the second semiconductor layers of the first fin structure to form second notches; and removing the second patterned mask layer, wherein in a direction parallel to a longitudinal axis of the first fin structure, a dimension of the first notches is greater than a dimension of the second notches, and the second p-type source/drain feature further fills the second notches.

5. The method for forming the semiconductor structure as claimed in claim 1, further comprising:

removing the first semiconductor layers of the first fin structure and the second fin structure, wherein the second semiconductor layers of the first fin structure form first nanostructures and the second semiconductor layers of the second fin structure form second nanostructures;

forming a first gate stack to surround the first nanostructures to form a first p-type transistor; and forming a second gate stack to surround the second nanostructures to form a second p-type transistor.

6. The method for forming the semiconductor structure as claimed in claim 5, wherein the first p-type transistor has a first threshold voltage, the second p-type transistor has a second threshold voltage, and an absolute value of the first threshold voltage is less than an absolute value of the second threshold voltage.

7. The method for forming the semiconductor structure as claimed in claim 5, wherein the first gate stack includes a first gate dielectric layer with a first dipole concentration, and the second gate stack includes a second gate dielectric layer with a second dipole concentration that is greater than the first dipole concentration.

8. A method for forming a semiconductor structure, comprising:

forming a stack in which first semiconductor layers and second semiconductor layers are alternatingly stacked over a substrate;

patterning the stack to form a first fin structure, a second fin structure and a third fin structure;

forming a first patterned mask layer to cover the second fin structure and the third fin structure;

laterally recessing the second semiconductor layers of the first fin structure while the second fin structures and the third fin structure are covered by the first patterned mask layer;

removing the first patterned mask layer;

forming a second patterned mask layer to cover the third fin structure;

forming a first epitaxial material with a first conductivity type on the first fin structure and the second fin structure;

removing the second patterned mask layer;

forming a third patterned mask layer to cover the first fin structure and the second fin structure; and forming a second epitaxial material with a second conductivity type on the third fin structure, wherein the second conductivity type is opposite to the first conductivity type.

9. The method for forming the semiconductor structure as claimed in claim 8, wherein the first conductivity type is p-type and the second conductivity type is n-type.

10. The method for forming the semiconductor structure as claimed in claim 8, wherein after laterally recessing the second semiconductor layers of the first fin structure, a length of the second semiconductor layers of the first fin structure is less than a length of the second semiconductor layers of the second fin structure.

11. The method for forming the semiconductor structure as claimed in claim 8, wherein:

patterning the stack comprises forming a fourth fin structure, the second semiconductor layers of the fourth fin structure are laterally recessed while the second fin structures and the third fin structure are covered by the first patterned mask layer, and the second epitaxial material is further formed on the fourth fin structure.

12. The method for forming the semiconductor structure as claimed in claim 8, further comprising:

forming a semiconductor isolation layer on each of the first to third fin structures before forming the first patterned mask layer to cover the second fin structure and the third fin structure.

13. The method for forming the semiconductor structure as claimed in claim 12, further comprising:

laterally recessing the first semiconductor layers of the first to third fin structure to form first notches before forming a first patterned mask layer to cover the second fin structure and the third fin structure; and forming inner spacer layers in the notches, wherein the second semiconductor layers of the first fin structure are laterally recessed to form second notches exposing the inner spacer layers formed on the first fin structure.

14. The method for forming the semiconductor structure as claimed in claim 8, further comprising:

removing the first semiconductor layers of the first to third fin structures, wherein the second semiconductor layers of the first to third fin structures form first nanostructures, second nanostructures and third nanostructures, respectively; and forming a first gate dielectric layer with a first dipole concentration around the first nanostructures;

forming a second gate dielectric layer with a first dipole concentration around the first nanostructures; and forming a third gate dielectric layer with a third dipole concentration around the third nanostructure, wherein the first dipole concentration is less than the second dipole concentration, and the second dipole concentration is less than the third dipole concentration.

15. A semiconductor structure, comprising:

a first p-type transistor with a first threshold voltage, wherein the first p-type transistor comprises:

a plurality of first nanostructures;

first and second source/drain features adjoining the first nanostructures; and a first gate stack wrapping around the first nanostructures; and a second p-type transistor with a second threshold voltage that is different than the first threshold voltage, wherein the second p-type transistor comprises:

a plurality of second nanostructures;

third and fourth source/drain features adjoining the second nanostructures; and a second gate stack wrapping around the second nanostructures, wherein a first distance between the first and second source/drain features is less than a second distance between the third and fourth source/drain features.

16. The semiconductor structure as claimed in claim 15, wherein an absolute value of the first threshold voltage is less than an absolute value of the second threshold voltage.

17. The semiconductor structure as claimed in claim 15, wherein the first gate stack includes a first high-k dielectric layer with a first dipole concentration, and the second gate stack includes a second high-k dielectric layer with a second dipole concentration that is greater than the first dipole concentration.

18. The semiconductor structure as claimed in claim 15, wherein the first nanostructures have concave sidewalls, and each of the first and second source/drain features have convex sidewalls that interface and mate with the concave sidewalls of the first nanostructures.

19. The semiconductor structure as claimed in claim 15, further comprising:

a third p-type transistor with a third threshold voltage that is different than the first and second threshold voltage, wherein the third p-type transistor comprises:

a plurality of third nanostructures;

fifth and sixth source/drain features adjoining the third nanostructures; and a third gate stack wrapping around the third nanostructures, wherein a third distance between the fifth and sixth source/drain features is greater than the second distance between the third and fourth source/drain features.

20. The semiconductor structure as claimed in claim 15, further comprising:

an n-type transistor with a third threshold voltage, wherein the n-type transistor comprises:

a plurality of third nanostructures;

fifth and sixth source/drain features adjoining the third nanostructures; and a third gate stack wrapping around the third nanostructures, wherein a third distance between the fifth and sixth source/drain features is greater than the first distance between the first and second source/drain features.

* * * * *